United States Patent
Shih et al.

(10) Patent No.: US 10,636,916 B2
(45) Date of Patent: Apr. 28, 2020

(54) HIGH ELECTRON MOBILITY THIN FILM TRANSISTORS

(71) Applicants: Ishiang Shih, Brossard (CA); Cindy X. Qiu, Brossard (CA); Chunong Qiu, Brossard (CA); Andy Shih, Brossard (CA); Julia Qiu, Brossard (CA); Yi-Chi Shih, Los Angeles, CA (US)

(72) Inventors: Ishiang Shih, Brossard (CA); Cindy X. Qiu, Brossard (CA); Chunong Qiu, Brossard (CA); Andy Shih, Brossard (CA); Julia Qiu, Brossard (CA); Yi-Chi Shih, Los Angeles, CA (US)

( * ) Notice: Subject to any disclaimer, the term of this patent is extended or adjusted under 35 U.S.C. 154(b) by 0 days.

(21) Appl. No.: 15/999,949

(22) Filed: Sep. 5, 2018

(65) Prior Publication Data

US 2020/0075778 A1 Mar. 5, 2020

(51) Int. Cl.
*H01L 29/778* (2006.01)
*H01L 29/786* (2006.01)
*H01L 29/66* (2006.01)

(52) U.S. Cl.
CPC .... *H01L 29/78696* (2013.01); *H01L 29/6656* (2013.01); *H01L 29/7782* (2013.01); *H01L 29/7869* (2013.01); *H01L 29/78618* (2013.01); *H01L 29/78633* (2013.01)

(58) Field of Classification Search
CPC ............... H01L 29/778; H01L 29/7781; H01L 29/7782; H01L 29/7783; H01L 29/7786; H01L 29/7787; H01L 29/78633; H01L 29/78678; H01L 29/7869

USPC .......................................................... 257/194
See application file for complete search history.

(56) References Cited

U.S. PATENT DOCUMENTS 7,632,726 B2 * 12/2009 Heying ............... H01L 23/3192
257/251
8,692,252 B2 * 4/2014 Takata .............. H01L 29/78696
257/43

* cited by examiner

*Primary Examiner* — Mark V Prenty

(57) ABSTRACT

Structures of high electron mobility thin film transistors (HEM-TFTs) are provided in this invention. In one embodiment, HEM-TFTs with a single heterojunction structure are disclosed to have a substrate, a first metal oxide channel layer, a first spacer layer, a first doped layer, a first barrier layer, a source, a drain and a gate. In another embodiment, HEM-TFTs with a double heterojunction structure are provided to have a substrate, a second barrier layer, a second doped layer, a second spacer layer, a first metal oxide channel layer, a second spacer layer, a second doped layer, a second barrier layer, a source, a drain and a gate. In yet another embodiment, HEM-TFTs with a single heterojunction structure are disclosed to comprise a substrate, a first metal oxynitride channel layer, a first spacer layer, a first doped layer, a first barrier layer, a source, a drain and a gate. In still another embodiment, HEM-TFTs with a double heterojunction structure are provided to include a substrate, a first barrier layer, a first doped layer, a first spacer layer, a first metal oxynitride channel layer, a second spacer layer, a second doped layer, a second barrier layer, a source, a drain and a gate.

10 Claims, 8 Drawing Sheets

300a

300EB

300c

300d

HIGH ELECTRON MOBILITY THIN FILM TRANSISTORS

FIELD OF THE INVENTION

This invention relates to thin film transistors for electronic displays. More specifically, it relates to high electron mobility thin film transistors having a barrier layer, a doped layer, a spacer layer and a channel layer made of metal oxides, metal oxynitrides and metal nitrides.

BACKGROUND OF THE INVENTION

In electronic displays, transistors in a thin film form (thin film transistors, TFTs) are required to form a two dimensional arrays for switching of light emitting devices or light valves. For electronic display applications, it is desirable to have the TFTs with a low series resistance in the ON state and small leakage current in the OFF state in order to reduce the unwanted joule heating loss and hence to reduce power consumption in operation. The series resistance of a TFT in ON state is mainly determined by the transport property (electron mobility and charge carrier density) of the channel layer semiconductor materials and it is inversely proportional to the charge carrier mobility and the sheet charge carrier density (the number of charge carriers per unit area). For TFTs with normal structures, the capacitances between the control gate and the channel layer and the gate operation voltage for ON state are limited. Hence, the sheet charge carrier density of the channel layer in ON state has a limited value: in the order of $10^{14}$ charge carriers per $cm^2$ or less. Therefore, the unwanted series resistance in ON state is mainly determined by the charge carrier mobility.

Until very recently in the electronic display technology, a majority of displays employs TFTs backplane with amorphous Si layer as the channels which has an electron mobility of 2 $cm^2$/V-sec or less. A small fraction of displays employ TFTs with polycrystalline Si which has an electron mobility of about 100 $cm^2$/V-sec, but these require more expensive equipment and substrates for preparation. More recently, TFTs with metal oxide or metal oxynitride semiconductors as the channel layers have been developed. These metal oxide and metal oxynitride TFTs have the benefits of low deposition temperature and high mobility, which is significantly higher than that for the amorphous Si TFTs but often still less than that for the polycrystalline Si TFTs. It is thus useful to develop thin film transistors with charge carrier mobility greater than 100 $cm^2$/V-sec and without the need of extensive deposition equipment and processes.

In radio frequency (RF) applications, transistors are used either as amplifiers or as switches and they are operated at high frequencies and must have high switching speed. In order to have high switching speed, transistors require to have high charge carrier mobility and small parasitic capacitances. In most of the Si technology, the field effect mobility of electrons is 350 $cm^2$/V-sec and the hole mobility is 90 $cm^2$/V-sec. In compound semiconductor technology, the field effect electron mobility is as high as 1500 to 6000 $cm^2$/V-sec for monocrystalline GaN and GaAs. However, both Si and compound semiconductor technologies required extensive equipment and processes. It would be important to develop device technology to provide transistors which can be deposited at low temperatures and with a high mobility using less extensive equipment and processes for RF applications.

BRIEF SUMMARY OF THE INVENTION

One object of this invention is to provide a top gate single heterojunction high electron mobility thin film transistor (HEM-TFT) having a substrate, a metal oxide channel layer, a spacer layer, a doped layer, a barrier layer, a source, a drain and a gate.

One other object of this invention is to provide a top gate double heterojunction HEM-TFT having a substrate, a first barrier layer, a first doped layer, a first spacer layer, a metal oxide channel layer, a second spacer layer, a second doped layer, a second barrier layer, a source, a drain and a gate.

Yet one other object of this invention is to provide a bottom gate single heterojunction HEM-TFT with a substrate, a gate, a barrier layer, a doped layer, a spacer layer, a metal oxide channel layer, a source and a drain.

Still one other object of this invention is to provide a bottom gate double heterojunction HEM-TFT with a substrate, a gate, a first barrier layer, a first doped layer, a first spacer layer, a metal oxide channel layer, a second spacer layer, a second doped layer, a second barrier layer, a source and a drain.

Another object of this invention is to provide a top gate single heterojunction HEM-TFT having a substrate, a metal oxynitride channel layer, a spacer layer, a doped layer, a barrier layer, a source, a drain and a gate.

Yet another object of this invention is to provide a top gate double heterojunction HEM-TFT having a substrate, a first barrier layer, a first doped layer, a first spacer layer, a metal oxynitride channel layer, a second spacer layer, a second doped layer, a second barrier layer, a source, a drain and a gate.

Still another object of this invention is to provide a bottom gate single heterojunction HEM-TFT having a substrate, a gate, a barrier layer, a doped layer, a spacer layer, a metal oxynitride channel layer, a source and a drain.

The final object of this invention is to provide a bottom gate double heterojunction HEM-TFT having a substrate, a gate, a first barrier layer, a first doped layer, a first spacer layer, a metal oxynitride channel layer, a second spacer layer, a second doped layer, a second barrier layer, a source and a drain.

DETAILED DESCRIPTION OF THE INVENTION

Figure 1B:
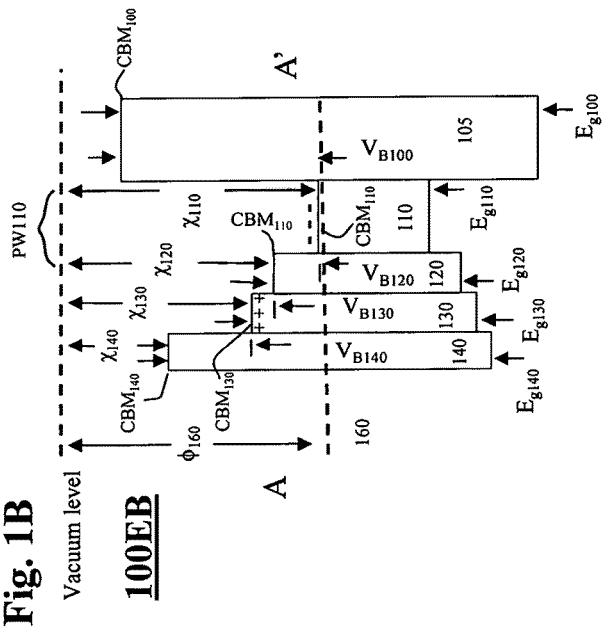
FIG. 1B shows a simplified energy band diagram (100EB) of the top gate single heterojunction HEM-TFT (100*a*) taken along line A-A' in FIG. 1A.
Figure 1A:
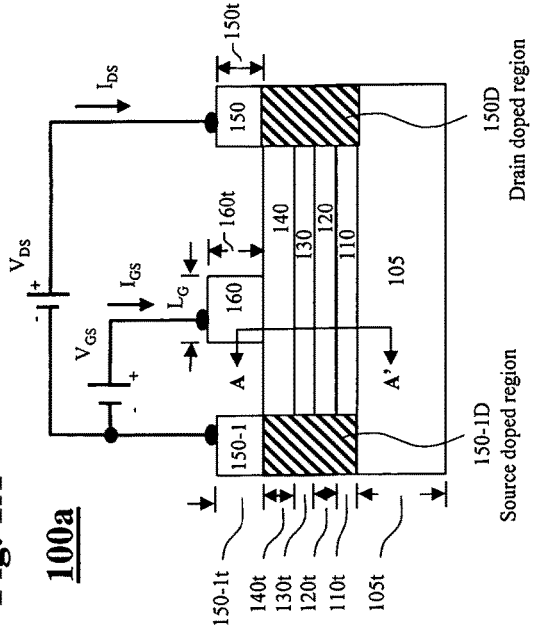
FIG. 1A shows a cross-sectional view of a top gate single heterojunction HEM-TFT (100*a*), wherein the first channel layer (110) is made of metal oxides, metal nitrides or metal oxynitrides.

Top Gate Single Heterojunction HEM-TFTs:

According to an embodiment of this invention, as shown in FIG. 1A, a top gate single heterojunction high electron mobility thin film transistor (HEM-TFT, 100a) is provided. The HEM-TFT (100a) comprises a substrate (105) having a substrate thickness (105t) and substrate energy gap $E_{g105}$ (see FIG. 1B); a first channel layer (110) having a first channel layer thickness (110t), a first channel electron affinity $\chi_{110}$ to and a first channel layer conduction band minimum $CBM_{110}$ (see FIG. 1B) and a first channel layer free charge carrier mobility $\mu_{110}$; a first spacer layer (120) with a first spacer layer thickness (120t), a first spacer layer conduction band minimum $CBM_{120}$ and a first spacer layer electron affinity $\chi_{120}$ (see FIG. 1B); a first doped layer (130) with a first doped layer thickness (130t), containing first doped layer impurity atoms with a first doped layer impurity concentration $N_{130}$, a first doped layer electron affinity $\chi_{130}$, a first doped layer conduction band minimum $CBM_{130}$ (see FIG. 1B), and a first doped layer free charge carrier mobility $\mu_{1130}$; a first barrier layer (140) with a first barrier layer thickness (140t), a first barrier layer electron affinity $\chi_{140}$, and a first barrier layer $CBM_{140}$ (see FIG. 1B), forming a single heterojunction between the first barrier layer (140) and the first channel layer (110). Thin film transistor (100a) also comprises a first source (150-1) with a first source thickness (150-1t); a first drain (150) with a first drain thickness (150t) and a first gate (160) with a first gate work function $\phi_{160}$ (see FIG. 1B), a first gate length $L_G$ and a first gate thickness (160t), forming a top gate single heterojunction HEM-TFT.

In order to minimize unwanted resistance between the first source (150-1) and the first channel layer (110), and between the first drain (150) and the first channel layer, a first source doped region (150-1D) and a first drain doped region (150D) are adopted in the top gate single heterojunction HEM-TFT (100a). The first source doped region (150-1D) has a high first source doped region concentration and the first drain doped region (150D) has a high first drain doped region concentration.

The material of the first channel layer (110) in HEM-TFT (100a) is selected from a group of metal oxides, metal oxynitrides and metal nitrides. The first channel layer (110) is preferably without any intentional doping or has a low first channel doping concentration and defect density to minimize unwanted scattering effect on the first channel charge carriers and the first channel layer free charge carrier mobility $\mu_{110}$ due to the impurity ions and the defect centers.

A simplified energy band diagram (100EB) of the top gate single heterojunction HEM-TFT (100a) taken along line A-A' in FIG. 1A, is shown in FIG. 1B. For the present single heterojunction HEM-TFT to function, the first channel electron affinity $\chi_{110}$ is greater than the first doped layer electron affinity $\chi_{130}$, the first spacer layer electro affinity $\chi_{120}$ and the first barrier layer electron affinity $\chi_{140}$, forming a first potential well (PW110) in the first channel layer (110) between the first spacer layer (120) and the substrate (105). In a n-type first doped layer (130), electrons thermally excited in the first doped layer (130) with a first doped layer impurity concentration $N_{130}$ form first doped layer free charge carriers $n_{130}$ with a first doped layer mobility $\mu_{130}$. When the first doped layer free charge carriers $n_{130}$ are remained in the first doped layer (130), the first doped layer mobility $\mu_{130}$ has a reduced value due to ion scatterings. Due to proximity and field effects, the first doped layer free charge carriers $n_{130}$ will flow and drop into the first potential well (PW110) to form first channel layer free charge carriers (- - -) with a first channel layer free charge carrier density $n_{110}$, a first channel layer free charge carrier sheet density $n_{S110}$, and a first channel layer electron mobility $\mu_{110}$. This leaves behind first doped layer impurity ions (+ + +) with a first doped layer impurity concentration $N_{130}$ in the first doped layer (130). Therefore, the first doped layer impurity ions (+ + +) and the first channel layer free charge carriers (- - -) are separates by the first spacer layer (120) to minimize interactions between the first doped layer impurity ions (+ + +) and the first channel layer free charge carriers (- - -) to reduce unwanted ion scattering and to obtain a high first channel layer electron mobility $\mu_{110}$. For this reason, the first channel layer electron mobility $\mu_{110}$ is much higher than the first doped layer mobility $\mu_{130}$. In prior art technologies, conventional TFTs are devoid of the first spacer layer (120) introduced by this invention, charge carriers in the channel of these conventional TFTs have a reduced mobility due to the unwanted impurity scatterings.

Without applying a gate voltage ($V_{GS}$), the first channel layer free charge carrier density $n_{110}$, and the first channel layer free charge carrier sheet density $n_{S110}$ are determined by the relative value of the first gate work function $\phi_{160}$, the first channel layer electron affinity $\chi_{110}$, and properties of the first spacer layer including the first spacer layer thickness (120t). When the first channel layer free charge carriers are electrons, the adoption of a first gate (160) with the gate work function $\phi_{160}$ substantially larger than $\chi_{110}$ would result in a low first channel layer electron sheet density $n_{S110}$. Conversely, a smaller first gate work function $\phi_{160}$ would result in a large first channel layer electron sheet density $n_{S110}$. When a gate voltage ($V_{GS}$) with varied values is applied between the first gate (160) and the first source (150-1), the first channel layer electron density $n_{110}$ in the first channel layer (110) or the first potential well (PW110) will be varied, causing regulations of a first channel layer resistivity $\rho_{110}$ and the first channel layer resistance between the first source (150-1) and the first drain (150).

A drain voltage $V_{DS}$ applied between the first drain (150) and the first source (150-1) will effect a flow of charge carriers (electrons) in the first channel layer (110) from the first source (150-1) to the first drain (150) to form a first drain current $I_{DS}$. During operation, any unwanted first gate current $I_{GS}$ flowing from the first gate (160) to the first source (150-1) should be kept as small as possible. It is noted that the polarity of the gate voltage may be reversed to effect the modulation of the first channel layer free charge carriers (- - -).

When doping of the first doped layer (130) is changed from n-type to p-type, the first doped layer free charge carriers $n_{130}$ and the first channel free charge carriers will be positive holes instead of negative electrons. Under such conditions, the polarity of $V_{GS}$ and $V_{DS}$ are reversed during operation as compared to the HEM-TFT with a n-type first doped layer (130). To simplify the descriptions, in the subsequent part of this invention, the gate voltage $V_{GS}$ and the drain voltage $V_{DS}$ will not be shown in the figures.

In certain applications such as electron displays, the present single heterojunction HEM-TFTs may need to have a dual gate, with a first gate and an additional second gate placed slightly apart and preferably in parallel. The dual grate structure will improve the operation reliability. For simplicity of descriptions, the present invention will be presented using a single gate structure.

Figure 2B:
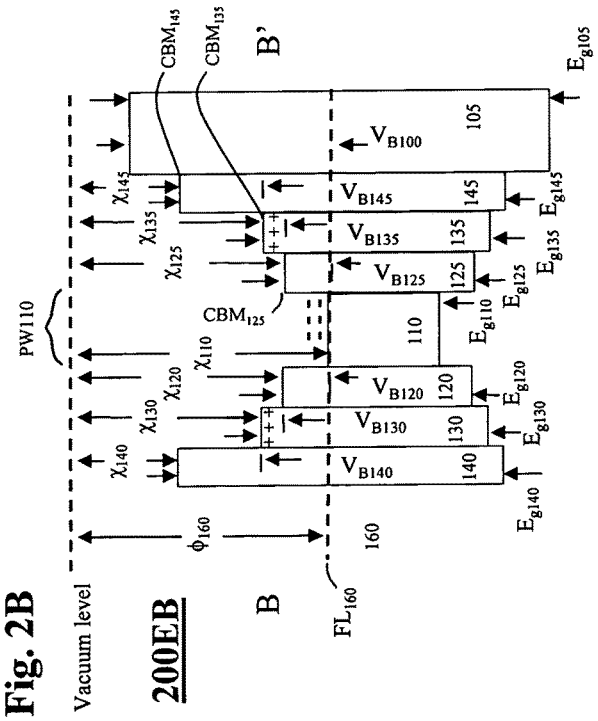
FIG. 2B shows a simplified energy band diagram (200EB) of the top gate double heterojunction HEM-TFT (200a) in FIG. 2A taken along line B-B'.
Figure 2D:
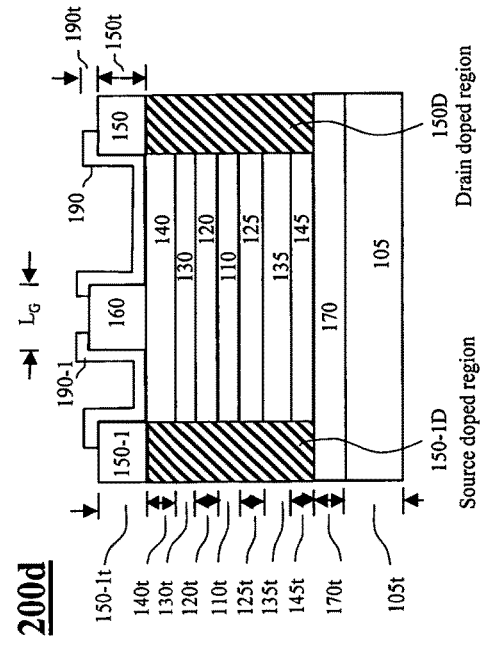
FIG. 2D is a cross-sectional view of a top gate double heterojunction HEM-TFT (200d) showing a surface passivation layer (190, 190-1) of a thickness (190t) disposed on top of the exposed first barrier layer (140) and parts of the first source (150-1), the first drain (150) and the first gate (160) to protect the top gate double heterojunction HEM-TFT (200d) and to increase its lifetime stability.
Figure 2A:
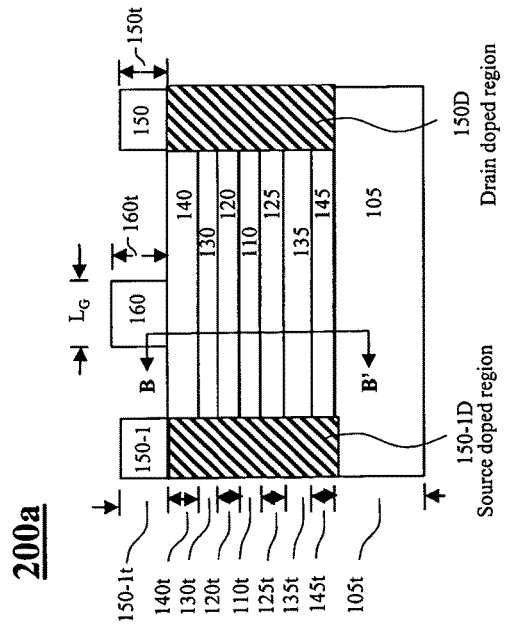
FIG. 2A shows a cross-sectional view of a top gate double heterojunction HEM-TFT (200a), wherein the first channel layer (110) is made of metal oxides, metal nitrides or metal oxynitrides.

Top Gate Double Heterojunction HEM-TFTs:

According to another embodiment of the invention, a top gate double heterojunction high electron mobility thin film transistor (200a) is provided in FIG. 2A. The HEM-TFT (200a) comprises a substrate (105) having a substrate thickness (105t) and substrate energy gap $E_{g105}$ (see FIG. 2B); a first channel layer (110) with a first channel layer thickness (110t) and a first channel layer electron affinity $\chi_{110}$; a first spacer layer (120) with a first spacer layer thickness (120t), a first spacer layer electron affinity $\chi_{120}$ and a first spacer layer $CBM_{120}$ (FIG. 2B); a first doped layer (130) with a first doped layer thickness (130t), containing first doped layer impurity atoms with a first doped layer impurity concentration $N_{130}$, a first doped layer electron affinity $\chi_{130}$, a first doped layer conduction band minimum $CBM_{130}$ (FIG. 2B) and a first doped layer mobility $\mu_{130}$; a first barrier layer (140) with a first barrier layer thickness (140t), a first barrier layer electron affinity $\chi_{140}$ and a first barrier layer conduction band minimum $CBM_{140}$ (FIG. 2B), forming a first heterojunction between the first barrier layer (140) and the first channel layer (110).

The HEM-TFT (200a) also comprises a second barrier layer (145) with a second barrier layer thickness (145t), a second barrier layer electron affinity $\chi_{145}$ and a second barrier layer conduction band minimum $CBM_{145}$ (FIG. 2B); a second doped layer (135) with a second doped layer thickness (135t), containing second doped layer impurity atoms with a second doped layer impurity concentration $N_{135}$, a second doped layer electron affinity $\chi_{135}$, a second doped layer $CBM_{145}$, (FIG. 2B) and a second doped layer mobility $\mu_{135}$; a second spacer layer (125) with a second spacer layer thickness (125t), a second spacer layer electron affinity $\chi_{125}$, and a second spacer layer $CBM_{125}$ (FIG. 2B), forming a second heterojunction between the second barrier layer (145) and the first channel layer (110); a first source (150-1) with a first source thickness (150-1t); a first drain (150) with a first drain thickness (150t); and a first gate (160) with a first gate work function $\phi_{160}$ (FIG. 2B), a first gate length $L_G$ and a first gate thickness (160t). The first heterojunction and second heterojunction together with the first source, the first drain and the first gate form a top gate double heterojunction HEM-TFT structure (200a).

In order to minimize unwanted resistance between the first source (150-1) and the first channel layer (110), and between the first drain (150) and the first channel layer (110), a first source doped region (150-1D) and a first drain doped region (150D) are adopted in the top gate double heterojunction HEM-TFT (200a). The first source doped region (150-1D) has a high first source doped region concentration and the first drain doped region (150D) has a high first drain doped region concentration.

Materials of the first channel layer (110) are selected from a group of metal oxides, metal oxynitrides, metal nitrides and their mixtures. The first channel layer (110) is preferably without intentional doping or has a low first channel doping concentration, with low impurity ion density and defect density to minimize unwanted scattering effect due to impurity ions and defect centers, and maximize a first channel electron mobility $\mu_{110}$.

A simplified energy band diagram (200EB) of the top gate double heterojunction HEM-TFT (200a) taken along line B-B' is shown in FIG. 2B. For the present double heterojunction HEM-TFT (200a) to function, the first channel electron affinity $\chi_{110}$ is greater than the first doped layer electron affinity $\chi_{130}$, the first spacer layer electron affinity $\chi_{120}$ and the first barrier layer electron affinity $\chi_{140}$. The first channel electron affinity $\chi_{110}$ is also greater than the second doped layer electron affinity $\chi_{135}$, the second spacer layer electron affinity $\chi_{125}$ and the second barrier layer electron affinity $\chi_{145}$, forming a first potential well (PW110) in first channel layer (110) between the second spacer layer (125) and first spacer layer (120).

In a n-type first doped layer (130), electrons thermally excited in the first doped layer (130) with a first doped layer impurity concentration $N_{130}$ form first doped layer free charge carriers $n_{130}$ with a first doped layer mobility $\mu_{130}$. When the first doped layer free charge carriers $n_{130}$ are remained in the first doped layer (130), the first doped layer mobility $\mu_{130}$ has a reduced value due to ion scattering. Due to the proximity and field effects, the first doped layer free charge carriers $n_{130}$ will flow and drop into the first potential well (PW110) and form a part I of the first channel layer free charge carriers (– – –) with a first channel layer free charge carrier density part I $n_{110-1}$, a first channel layer free charge carrier sheet density part I $n_{S110-1}$, and a first channel layer electron mobility $\mu_{110}$. This leaves behind first doped layer impurity ions (+ + +) with a first doped layer impurity concentration $N_{130}$ in the first doped layer (130). Therefore, the first doped layer impurity ions (+ + +) and part I of the first channel layer free charge carriers (– – –) are separated by the first spacer layer (120) to minimize interactions between the first doped layer impurity ions (+ + +) and part I of the first channel layer free charge carriers (– – –) to reduce unwanted ion scattering and to obtain a high first channel electron mobility $\mu_{110}$. Hence, the first channel layer electron mobility $\mu_{110}$ is much higher than the first doped layer mobility $\mu_{130}$.

In a n-type second doped layer (135), electrons thermally excited in the second doped layer with a second doped layer impurity concentration $N_{135}$ form second doped layer free charge carriers $n_{135}$ with a second doped layer mobility $\mu_{135}$. When the second doped layer free charge carriers $n_{135}$ are remained in the second doped layer (135), the second doped layer mobility $\mu_{135}$ has a reduced value due to ion scattering. Due to the proximity and field effects, the second doped layer free charge carriers $n_{135}$ will flow and drop into the first potential well (PW110) to form a part II of the first channel layer free charge carriers (– – –) with a first channel layer free charge carrier density part II $n_{110-2}$, a first channel layer free charge carrier sheet density part II $n_{S110-2}$, and a first channel layer electron mobility $\mu_{110}$. This leaves behind second doped layer impurity ions (+ + +) with a second doped layer impurity concentration $N_{135}$ in the second doped layer (135). Therefore, the second doped layer impurity ions (+ + +) and part II of the first channel layer free charge carriers (– – –) are separated by the second spacer layer (125) to minimize interactions between the second doped layer impurity ions (+ + +) and part II of the first channel layer free charge carriers (– – –) to reduce unwanted ion scattering and to obtain a high first channel layer electron mobility $\mu_{110}$. Hence, the first channel layer electron mobility $\mu_{110}$ is much higher than the second doped layer mobility $\mu_{135}$.

The first channel layer free charge carrier density $n_{110}$ is equal to the sum of the first channel layer free charge carrier density part I $n_{110-1}$ and the first channel layer free charge carrier density part II $n_{110-2}$: $n_{110}=n_{110-1}+n_{110-2}$ and it is larger than either $n_{110-1}$ or $n_{110-2}$ when a single heterojunction structure is employed. The first channel layer free charge carrier sheet density $n_{S110}$ is equal to the sum of the first channel layer free charge carrier sheet density part I $n_{S110-1}$ and the first channel layer free charge carrier sheet density part II $n_{S110-2}$: $n_{S110}=n_{S110-1}+n_{S110-2}$ and is larger than either $n_{S110-1}$ or $n_{S110-2}$ when a single heterojunction structure is employed.

Without applying a voltage ($V_{GS}$, not shown in FIG. 2A), the first channel layer free charge carrier density $n_{110}$ and the first channel layer free charge carrier sheet density $n_{S110}$ are determined by the relative value of the first gate work function $\phi_{160}$, the first channel layer electron affinity $\chi_{no}$, and properties of the first spacer layer including the first spacer layer thickness (120t). When the first channel layer free charge carriers are electrons, the adoption of a first gate (160) with the gate work function $\phi_{160}$ substantially larger than $\chi_{110}$ would result in a low first channel layer free charge carrier sheet density $n_{S110}$. Conversely, a smaller first gate work function $\phi_{160}$ would result in a large first channel layer free charge carrier sheet density $n_{S110}$. When a gate voltage ($V_{GS}$) with varied values is applied between the first gate (160) and the first source (150-1), the first channel layer free charge carrier density $n_{110}$ in the first channel layer (110) or the first potential well (PW110) will be varied, causing regulations of a first channel layer resistivity $\rho_{110}$ and hence the first channel layer resistance between the first source (150-1) and the first drain (150).

A drain voltage $V_{DS}$ applied between the first drain (150) and the first source (150-1) will effect a flow of charge carriers or electrons in the first channel layer (110) from the first source to the first drain to form a first drain current $I_{DS}$. During operation, any unwanted first gate current $I_{GS}$ flowing from the first gate to the first source should be kept as small as possible. It is noted that the polarity of the gate voltage may be reversed to effect the modulation of the first channel layer free charge carriers (- - - -).

When the doping of the first/second doped layers (130, 135) is changed from n-type to p-type, the first doped layer free charge carriers $n_{130}$ and part I of the first channel layer free charge carriers, the second doped layer free charge carriers $n_{135}$ and part II of the first channel layer free charge carriers will be positive holes instead of negative electrons. Under such conditions, the polarity of the first gate to first source voltage $V_{GS}$ and the first drain to first source voltage $V_{DS}$ are reversed during operation as compared to the double heterojunction HEM-TFT with a n-type first/second doped layers (130, 135) and negative electrons in the first channel layer (110).

In certain applications such as electron displays, the present double heterojunction HEM-TFTs may need to have a dual gate, with a first gate and an additional second gate placed slightly apart and preferably in parallel. The dual grate structure will improve the operation reliability.

Materials, Thicknesses and Properties of the Top Gate HEM-TFTs:

Substrate (105):

The substrate (105) in above described top gate HEM-TFTs may be selected from a material group including: glass sheets, metal sheets, Si substrate and plastic sheets such as PET, PEN, PC and the substrate thickness (105*t*) is preferably to be 1 mm or less and is more preferably to be 100 μm or less with a substrate energy gap $Eg_{105}$ as large as possible. For RF applications, the substrate thickness requires to have a very precise control to be within +/−1 μm. The exact substrate thickness will be determined by the transmission line impedance, usually 50 ohm.

First Channel Layer (110):

According to one embodiment of this invention, materials of the first channel layer (110) in the top gate HEM-TFTs are selected from a group of metal oxides, including but not limited to: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, SrO, ScO, $Y_2O_3$, LaO, LuO and their mixtures.

According to another embodiment of the invention, materials of the first channel layer (110) are selected from a group of metal oxynitrides, including but not limited to: ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures.

According to one other embodiment of this invention, materials of the first channel layer (110) are selected from a group of metal nitrides, including but not limited to: ZnN, InN, GaN, SnN, AlN, HfN, ZrN, TiN, CaN, MgN, SiN, BN, BaN, TaN, MoN, WN, GdN, SrN, ScN, YN, LaN, LuN and their mixtures.

The first channel layer thickness (110*t*) is selected to be in a range of 1 to 200 nm, and is more preferably to be in a range of 1 to 100 nm. In order to obtain high first channel layer electron mobility $\mu_{110}$ for a low ON state resistance and a very high OFF state resistance, the first channel layer (110) is preferably undoped or lightly doped so that it has a low ion concentration to minimize unwanted ion scattering and it has a low defect density to reduce charge carrier trapping and scattering.

The electron affinity χ of a given substance is defined as the difference between the vacuum level and the conduction band minimum CBM. As shown in FIGS. 1B and 2B, the first channel layer (110) which may be a metal oxide, a metal oxynitride or a metal nitride, has a first channel layer electronic affinity $\chi_{110}$, a first channel layer conduction band minimum $CBM_{110}$ and a first channel layer energy gap $E_{g110}$. The elemental composition of the first channel layer is selected so that the first channel layer electron affinity $\chi_{110}$ has a value close to 4 eV or slightly larger.

First and Second Spacer Layers (120, 125):

According to one embodiment of this invention, materials of the first spacer layer (120) and the second spacer layer (125) in the top gate HEM-TFTs may be selected from a group of metal oxides, including but not limited to: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO WO, GdO, SrO, ScO, $Y_2O_3$, LaO, LuO and their mixtures. The materials of the first spacer layer (120) and the second spacer layer (125) may also be selected from a material group of metal oxynitrides, including but not limited to: ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The spacer layers (120) and (125) can still be made of metal nitrides, including but not limited to: ZnN, InN, GaN, SnN, AlN, HfN, ZrN, TiN, CaN, MgN, SiN, BN, BaN, TaN, MoN, WN, GdN, SrN, ScN, YN, LaN, LuN and their mixtures.

The first spacer layer thickness (120*t*) and the second spacer layer thickness (125*t*) are preferably to be in a range of 0.3 to 5 nm, and are more preferably to be in a range of 0.5 to 2 nm to facilitate charge carrier separation from the first doped layer (130) and the second doped layer (135). The first spacer layer and the second spacer layer are preferably undoped or lightly doped so that it has a low charge carrier density and a low density of ionized impurities or defect centers to minimize unwanted ion scattering and trapping of charge carriers.

For a top gate single heterojunction HEM-TFT, the elemental composition of the first spacer layer (120) is selected so that the first spacer layer electron affinity $\chi_{120}$ has a value less than the first channel layer electron affinity $\chi_{110}$. The difference between the first spacer layer electron affinity $\chi_{120}$ and the first channel layer electron affinity $\chi_{110}$ should be large enough to facilitate formation of the first potential well PW110 and to prevent first channel layer charge carriers from escaping through the first spacer layer during operation. It is also preferred to have the first spacer layer energy gap $E_{g120}$ larger than the first channel layer energy gap $E_{g110}$.

For a top gate double heterojunction HEM-TFT, the elemental compositions of the first spacer layer (120) and the second spacer layer (125) are selected so that the first spacer layer electron affinity $\chi_{120}$ and second spacer layer electron affinity $\chi_{125}$ have values less than the first channel layer electron affinity $\chi_{110}$. The difference between the first spacer layer electron affinity $\chi_{120}$ and the first channel layer electron affinity $\chi_{110}$ and the difference between the second spacer layer electron affinity $\chi_{125}$ and the first channel layer electron affinity $\chi_{110}$ should be large enough to facilitate formation of the first potential well PW110 and to prevent first channel layer charge carriers from escaping through the first spacer layer and the second spacer layer during operation. It is also preferred to have the first spacer layer energy gap $E_{g120}$ and second spacer layer energy gap $E_{g125}$ larger than the first channel layer energy gap $E_{g110}$.

First and Second Doped Layers (130, 135):

For a top gate single heterojunction HEM-TFTs such as (100a), materials of the first doped layer (130) may be selected from a group of metal oxides, including: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, $Sr_2O_3$, ScO, $Y_2O_3$, LaO, LuO and their mixtures. The materials of the first doped layer (130) may also be selected from a group of metal oxynitrides, including: ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The materials of the first doped layer (130) may still be selected from a group of metal nitrides, including: ZnN, InN, GaN, SnN, AlN, HfN, ZrN, TiN, CaN, MgN, SiN, BN, BaN, TaN, MoN, WN, GdN, SrN, ScN, YN, LaN, LuN and their mixtures.

In a top gate single heterojunction HEM-TFT such as (100a), the first doped layer thickness (130t) is selected to be in a range of 0.5 to 50 nm, and it is more preferably to be in a range of 0.5 to 20 nm. The first doped layer is preferably highly doped so that it has a high first doped layer impurity concentration $N_{130}$ and a high density of first doped layer impurity ion concentration. The first doped layer impurity concentration $N_{130}$ is preferably larger than $10^{18}$ cm$^{-3}$ and more preferably larger than $10^{19}$ cm$^{-3}$, so that a first doped layer sheet impurity concentration $S_{130}$ which is equal to $N_{130} \times 130t$, is preferably greater than $10^{12}$ cm$^{-2}$ and more preferably greater than $10^{13}$ cm$^{-2}$. And the first channel layer free charge carrier sheet density $n_{S110}$ which is equal to $n_{110} \times 110t$ is preferably greater than $10^{12}$ cm$^{-2}$ and more preferably greater than $10^{13}$ cm$^{-2}$.

For the top gate single heterojunction HEM-TFTs, the elemental composition of the first doped layer (130) is selected so that the first doped layer electron affinity $\chi_{130}$ has a value equal to or smaller than the first spacer layer electron affinity $\chi_{120}$+kT, where kT is the thermal energy of the first doped layer charge carriers, k is the Boltzman constant and T is the temperature. The first doped layer electron affinity $\chi_{130}$ should be selected to allow most of the first doped layer free charge carriers (- - -) to flow to the first potential well PW110 in the first channel layer (110), so that $n_{110} \approx n_{130}$.

For a top gate double heterojunction HEM-TFT such as (200a), materials of the first doped layer (130) and materials of the second doped layer (135) may be selected from a group of metal oxides, including: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, $Sr_2O_3$, ScO, $Y_2O_3$, LaO, LuO and their mixtures. The materials of the first doped layer (130) and materials of the second doped layer (135) may also be selected from a group of metal oxynitrides, including: ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The materials of the first doped layer (130) and materials of the second doped layer (135) may still be selected from a group of metal nitrides, including: ZnN, InN, GaN, SnN, AlN, HfN, ZrN, TiN, CaN, MgN, SiN, BN, BaN, TaN, MoN, WN, GdN, SrN, ScN, YN, LaN, LuN and their mixtures.

In a top gate double heterojunction HEM-TFT such as (200a), the first doped layer thickness (130t) and the second doped layer thickness (135t) are selected to be in a range of 0.5 to 50 nm, and are more preferably to be in a range of 1 to 20 nm. The first doped layer (130) and the second doped layer (135) are preferably highly doped so that they have a high first doped layer impurity concentration $N_{130}$, a high second doped layer impurity concentration $N_{135}$ and a high density of first/second doped layer impurity ion concentration. The first doped layer impurity concentration $N_{130}$ is preferably larger than $10^{18}$ cm$^{-3}$ and more preferably greater than $10^{19}$ cm$^{-3}$, so that a first doped layer sheet impurity concentration $S_{130}$ which is equal to $N_{130} \times 130t$, is greater than $10^{12}$ cm$^{-2}$ and more preferably greater than $10^{13}$ cm$^{-2}$. And the first channel layer free charge carrier sheet density part I $n_{S110-1}$ which is equal $n_{110-1} \times 110t$ is greater than $10^{12}$ cm$^{-2}$ and more preferably greater than $10^{13}$ cm$^{-2}$. The second doped layer impurity concentration $N_{135}$ is preferably larger than $10^{18}$ cm$^{-3}$ and more preferably greater than $10^{19}$ cm$^{-3}$, so that a second doped layer sheet impurity concentration $S_{135}$ which is equal to $N_{135} \times 135t$, is greater than $10^{12}$ cm$^{-2}$ and more preferably greater than $10^{13}$ cm$^{-2}$. And the first channel layer free charge carrier sheet density part II $n_{S110-2}$ which is equal $n_{110-2} \times 110t$ is greater than $10^{12}$ cm$^{-2}$ and more preferably greater than $10^{13}$ cm$^{-2}$.

For the top gate double heterojunction HEM-TFTs, the elemental composition of the first doped layer (130) is selected so that the first doped layer electron affinity $\chi_{130}$ has a value equal or smaller than the first spacer layer electron affinity $\chi_{120}$+kT, where kT is the thermal energy of the first doped layer charge carriers. The elemental composition of the second doped layer (135) is selected so that the second doped layer electron affinity $\chi_{135}$ has a value equal or smaller than the second spacer layer electron affinity $\chi_{125}$+kT, where kT is the thermal energy of the second doped layer charge carriers. The selection of the first doped layer electron affinity $\chi_{130}$ should allow most of the first doped layer free charge carriers $n_{130}$ to flow to the first potential well PW110 in the first channel layer and selection of the second doped layer electron affinity $\chi_{135}$ should allow most of the second doped layer free charge carriers $n_{135}$ to flow to the first potential well PW110, so that $n_{110} \approx n_{130} + n_{135}$. It is also preferred to have the first doped layer energy gap $E_{g130}$ and second doped layer energy gap $E_{g135}$ substantially close to the first spacer layer energy gap $E_{g120}$ and the second spacer layer energy gap $E_{g125}$.

Doping of the first doped layer (130) and the second doped layer (135) may be achieved by intrinsic doping including adjusting the oxygen vacancies and/or the nitrogen vacancies, or by extrinsic doping through adding of impurities. The intrinsic doping may be achieved by adjusting the metal to oxygen and/or nitrogen ratios during manufacturing. For the extrinsic doping of the first doped layer and the second doped layer, various elements from the following doping material group may be adopted: Sb, F, As, Nb, Ta, Al, Ga, B, In, Y, Sc, V, Si, Ge, Ti, Zr, Hf, Mg, As, H, Sn, Mo, W, Zr and F.

First and Second Barrier Layers (140, 145):

For a HEM-TFT with a single heterojunction structure such as (100a), materials of the first barrier layer (140) are selected from a group of metal oxides, including: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, $Sr_2O_3$, ScO, $Y_2O_3$, $La_2O_3$, $Lu_2O_3$ and their mixtures. The materials of the first barrier layer (140) may also be selected from a group of metal oxynitride, including: ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The materials of the first barrier layer (140) may still be selected from a group of metal nitrides, including ZnN, InN, GaN, SnN, AlN, HfN, ZrN, TiN, CaN, MgN, SiN, BN, BaN, TaN, MoN, WN, GdN, SrN, ScN, YN, LaN, LuN and their mixtures.

In the single heterojunction HEM-TFTs, the first barrier layer thickness (140*t*) is preferably to be in a range of 0.5 to 50 nm, and it is more preferably to be in a range of 1 to 20 nm. The exact value of the first barrier layer thickness is selected by the modulation effects of the first gate (160) on the first channel layer free charge carrier density $n_{110}$, threshold voltage, and the constraint for unwanted first gate current $I_{GS}$ during the operation. The first barrier layer is preferably undoped and having a large first barrier layer band gap $E_{g140}$, so that it has a large electric resistivity and dielectric strength.

For the HEM-TFTs with a double heterojunction structure, materials of the first barrier layer (140) and the second barrier layer (145) are selected from a group of metal oxides, including: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, $Sr_2O_3$, ScO, $Y_2O_3$, $La_2O_3$, $Lu_2O_3$ and their mixtures. The materials of the first barrier layer (140) and the second bather layer (145) may also be selected from a group of metal oxynitrides, including: ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The materials of the first barrier layer (140) and the second barrier layers (145) may still be selected from a material group of metal nitrides, including: ZnN, InN, GaN, SnN, AlN, HfN, ZrN, TiN, CaN, MgN, SiN, BN, BaN, TaN, MoN, WN, GdN, SrN, ScN, YN, LaN, LuN and their mixtures.

In the double heterojunction HEM-TFTs, the first barrier layer thickness (140*t*) and the second barrier layer thickness (145*t*) are preferably to be in a range of 0.5 to 50 nm, and are more preferably to be in a range of 1 to 20 nm. The exact values of the first barrier layer thickness (140*t*) and the second barrier layer thickness (145*t*) are selected by the modulation effects of the first gate (160) on the first channel layer free carrier concentration $n_{110}$, the threshold voltage, and the constraint for unwanted first gate current $I_{GS}$ during the operation. The first barrier layer (140) and the second barrier layer (145) are preferably undoped and having large barrier layer band gaps $E_{g140}$ and $E_{g145}$, so that they have a large electric resistivity and a high dielectric strength.

As shown in FIG. 1B for a single heterojunction HEM-TFT, the first barrier layer electron affinity $\chi_{140}$ is less than the first doped layer electron affinity $\chi_{130}$. As shown in FIG. 2B for a double heterojunction HEM-TFT, the first barrier layer electron affinity $\chi_{140}$ and the second barrier layer electron affinity $\chi_{145}$ are less than the first doped layer electron affinity $\chi_{130}$ and the second doped layer electron affinity $\chi_{135}$.

First Gate, First Source and First Drain (160, 150-1, 150):

In the top gate HEM-TFTs such as (100*a*) and (200*a*), the first gate (160) makes a contact to the first barrier layer (140) and should create a rectifying contact or an insulated contact in order to effect the modulation of the first channel layer free charge carrier density $n_{110}$ without a large flow of an unwanted first gate current $I_{GS}$. The first gate work function $\phi_{160}$ is determined by the material composition of the first gate contacting the first barrier layer (140) or the first gate insulator layer (180, shown in FIGS. 1E and 2E) and is selected to have a value preferably larger than 4.8 eV and more preferably larger than 5 eV for negative first channel layer free charge carriers. A large gate work function $\phi_{160}$ will create a first channel depletion layer under the first gate (160) so that the HEM-TFT is in or near to an OFF state without the application of a significant gate voltage $V_{GS}$.

The first gate thickness (160*t*) is selected in a range of 10 to 3000 nm and the first gate length $L_G$ is selected in a range of 5 to 3000 nm. Materials of the first gate (160) are selected from a group including: Ti, Ge, In, Hf, Al, Ni, Pt, Co, Pd, Mo, Ta, W, Cu, Ag, Au, and their alloys so that the first gate layer to contact the first barrier layer (140) or the first gate insulator layer (180, in FIGS. 1E and 2E) can form a rectifying Schottky junction or an insulated contact (as shown in FIGS. 1E and 2E) for operation.

The first source (150-1) and the first drain (150) in the HEM-TFTs (100*a*) and (200*a*) shown in FIGS. 1A and 2A are making contacts to the first channel layer (110) through the first barrier layer (140), the first doped layer (130) and the first spacer layer (120). During the operation, in order to allow an easy flow of first channel layer free charge carriers from the source (150-1) to the drain (150), the contact between the first source (150-1) and the first barrier layer (140), and the contact between the first drain (150) and the first barrier layer (140) should be ohmic contacts with low unwanted contact resistance. Materials of the first source (150-1) and the first drain (150) are selected from a group including: Ti, Ge, In, Hf, Al, Ni, Pt, Co, Pd, Mo, Ta, W, Cu, Ag, Au and their alloys so that the first layer of the first source (150-1) and the first drain (150) to contact the first barrier layer (140) can form an ohmic contact.

In order to minimize unwanted resistance between the first source (150-1) and the first channel layer (110), and between the first drain (150) and the first channel layer, a first source doped region (150-1D) and a first drain doped region (150D) are adopted. The first source doped region has a high first source doped region concentration and the first drain doped region has a high first drain doped region concentration, to a level larger than $10^{19}$ $cm^{-3}$ or preferably larger than $10^{20}$ $cm^{-3}$. These high doping levels reduce the thickness of the depletion layers formed, allowing for easy direct flow or tunneling of charge carriers and decreasing any unwanted contact resistances. Alternately, at regions immediately under the first source and the first drain, material of the first barrier layer (140) may be removed partly or completely before forming or depositing the first source and the first drain, in order to reduce the unwanted contact resistances.

Substrate Barrier Layer (170):

Micro defects or contaminations on the surfaces of the substrate (105) and unwanted penetration of water or oxygen molecules in a plastic substrate can cause defects in the first channel layer (110), the spacer layers (120), the first doped layer (130) and the barrier layer (140), leading to degradation in performance or uniformity of the present top gate HEM-TFTs having a single heterojunction (100*a*) or a double heterojunction (200*a*).

Figure 1C:
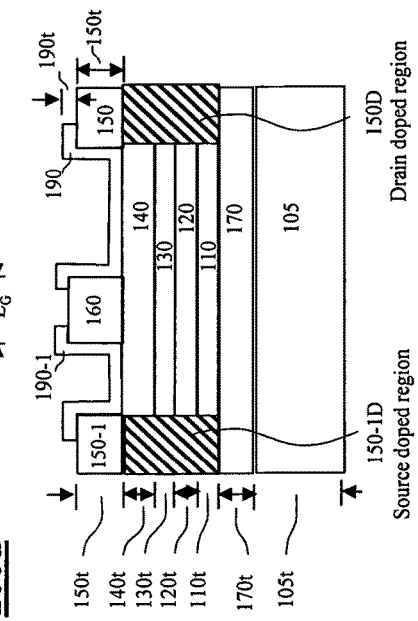
FIG. 1C is a cross-sectional view of a top gate single heterojunction HEM-TFT (100*c*) showing a substrate barrier layer (170) of a thickness (170*t*) deposited on top of the substrate (105) to minimize effects of micro defects, contaminants, water molecules and oxygen molecules on the substrate and to enhance the lifetime stability of the top gate single heterojunction HEM-TFT (100*c*).

Hence, according to one embodiment of the invention, a substrate barrier layer (170) of a substrate barrier layer thickness (170*t*) is added into the top gate single heterojunction HEM-TFT (100*a*) to form a top gate single heterojunction HEM-TFT (100*c*) as shown in FIG. 1C. The substrate barrier layer (170) is disposed on top of the substrate (105) and beneath the first channel layer (110) to minimize effects of micro defects, contaminants, water molecules and oxygen molecules on the substrate (105) and to enhance lifetime stability of the single heterojunction HEM-TFT (100c).

Figure 2C:
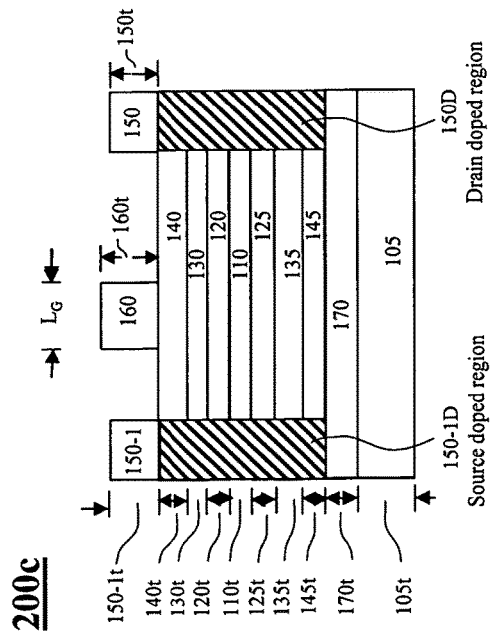
FIG. 2C is cross-sectional view of a top gate double heterojunction HEM-TFT (200c) showing a substrate barrier layer (170) of a thickness (170t) disposed on top of the substrate to minimize effects of micro defects, contaminants, water molecules and oxygen molecules on the substrate and to enhance the lifetime stability of the top gate double heterojunction HEM-TFT (200c).
Figure 2E:
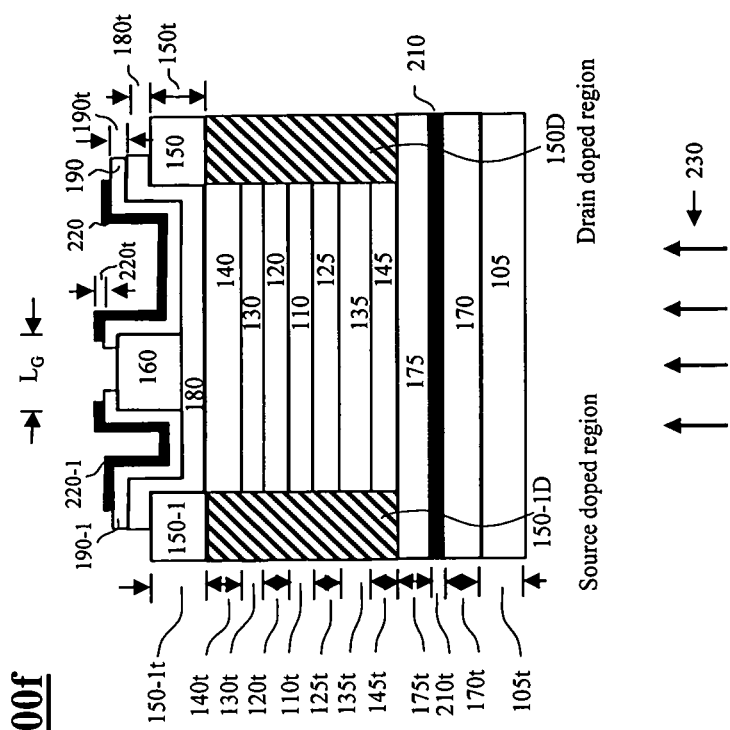
FIG. 2E is cross-sectional view of a top gate double heterojunction HEM-TFT (200e) showing a first gate insulator layer (180) of a thickness (180t) disposed beneath the first gate (160) and on top of the exposed first barrier layer (140) and parts of the first source and the first drain to reduce the current $I_{GS}$ increase the breakdown voltage and to enhance the uniformity during operation of the device (200e) and to increase its lifetime stability.

According to one other embodiment of this invention, a substrate barrier layer (170) of a substrate barrier layer thickness (170t) is added into the top gate double heterojunction HEM-TFT (200a) to form a top gate double heterojunction HEM-TFT (200c) as shown in FIG. 2C. The substrate barrier layer (170) is disposed between the substrate (105) and the second barrier layer (145) to minimize effects of micro defects, contaminants, water molecules and oxygen molecules on the substrate and to enhance lifetime stability of the double heterojunction HEM-TFT (200c).

Materials of the substrate barrier layer (170) may be selected from a group of oxides, oxynitrides and nitrides, including but not limited to: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, SrO, ScO, $Y_2O_3$, LaO, LuO, ZnN, InN, GaN, SnN, AlN, HfN, ZrN, TiN, CaN, MgN, SiN, BN, BaN, TaN, MoN, WN, GdN, SrN, ScN, YN, LaN, LuN, ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The substrate barrier layer thickness (170t) may be selected in a range of 5 nm to 10 μm.

Surface Passivation Layer (190, 190-1):

During operations, HEM-TFTs are often exposed to the room air and unwanted contaminants including molecules of water and oxygen may adhere to the surfaces of the devices and penetrate to the first channel layer to affect or vary performance of the HEM-TFTs.

Figure 1D:
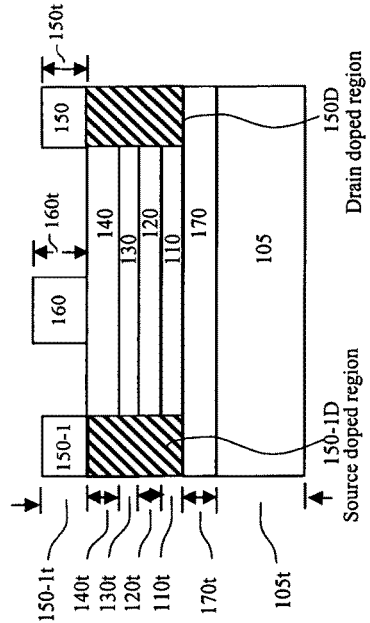
FIG. 1D is a cross-sectional view of a top gate single heterojunction HEM-TFT (100*d*) showing a surface passivation layer (190, 190-1) of a thickness (190*t*) disposed on top of the exposed first barrier layer (140) and parts of the first source (150-1), the first drain (150) and the first gate (160) to protect the top gate single heterojunction HEM-TFT (100*d*) and to increase its lifetime stability.

According to one embodiment of the invention, a surface passivation layer (190, 190-1) of a surface passivation layer thickness (190t) is added in the top gate single heterojunction HEM-TFT (100c) to form a top gate single heterojunction HEM-TFT (100d) as shown in FIG. 1D. The surface passivation layer (190, 190-1) is disposed on top of the exposed first barrier layer (140) and parts of the first source, the first drain and the first gate.

According another embodiment of this invention, a surface passivation layer (190, 190-1) of a surface passivation layer thickness (190t) is added into the top gate double heterojunction HEM-TFT (200c) to form a top gate double heterojunction HEM-TFT (200d) as shown in FIG. 2D. The surface passivation layer (190, 190-1) is disposed on top of the exposed first barrier layer (140) and parts of the first source, the first drain and the first gate.

The main purpose of the surface passivation layer (190, 190-1) is to protect the HEM-TFTs (100d, 200d) and to increase their lifetime stability. Materials of the surface passivation layer (190, 190-1) may be selected from a group of oxides, oxynitrides and nitrides, including: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, SrO, ScO, $Y_2O_3$, LaO, LuO, ZnN, InN, GaN, SnN, AlN, HfN, ZrN, TiN, CaN, MgN, SiN, BN, BaN, TaN, MoN, WN, GdN, SrN, ScN, YN, LaN, LuN, ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The surface passivation layer thickness (190t) may be selected in a range of 20 to 5000 nm.

First Gate Insulator Layer (180):

One of the issues on the thermal stability of operation in a HEM-TFT is too large a first gate current $I_{GS}$ or even a breakdown between the first gate and the first source. Steps are provided to reduce these unwanted effects from happening and to ensure the performance uniformity of the HEM-TFT.

Therefore, according to one embodiment of this invention, a first gate insulator layer (180) of a first gate insulator layer thickness (180t) is added in the top gate single heterojunction HEM-TFT (100d) to form a top gate single heterojunction HEM-TFT (100e) as shown in FIG. 1E. The first gate insulator layer (180) is disposed beneath the first gate (160) and the surface passivation layer (190, 190-1) and on top of the first barrier layer (140) and parts of the first source (150-1) and the first drain (150).

According to another embodiment of this invention, a first gate insulator layer (180) of a first gate insulator layer thickness (180t) is added in the top gate double heterojunction HEM-TFT (200d) to form a top gate double heterojunction HEM-TFT (200e) as shown in FIG. 2E. The first gate insulator layer (180) is disposed beneath the first gate (160) and the surface passivation layer (190, 190-1) and on top of the first barrier layer (140) and parts of the first source (150-1) and the first drain (150).

The main purpose of the first gate insulator layer (180) is to reduce the first gate current $I_{GS}$, to increase the breakdown voltage and to enhance the uniformity during operation of the devices (100e and 200e) and to increase their lifetime stability. Materials of the first gate insulator layer (180) may be selected from a group of oxides, oxynitrides and nitrides, including: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, SrO, ScO, $Y_2O_3$, LaO, LuO, ZnN, InN, GaN, SnN, AlN, HfN, ZrN, TiN, CaN, MgN, SiN, BN, BaN, TaN, MoN, WN, GdN, SrN, ScN, YN, LaN, LuN, ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The first gate insulator layer thickness (180t) may be selected in a range of 1 to 300 nm.

First and Second Light Shield Layers (210, 220):

When the HEM-TFTs (100e, 200e) are used in switching circuits for electronic displays, as shown in FIGS. 1E and 2E, there may be a constant backside light (230) and a front-side light (240). The light (230 and 240) is either from internal light sources in the electrons displays or from the environment. Part of the light (230, 240) will reach the HEM-TFTs (100e, 200e) and be absorbed by the first channel layer, the spacer layer(s), the doped layer(s) and even the barrier layer(s). The light absorption will cause excitation of electron-hole pairs and increase the gate current $I_{GS}$ and the drain current $I_{DS}$. This often lead to increase in power consumption and performance degradation of the devices (100e, 200e).

Figure 1F:
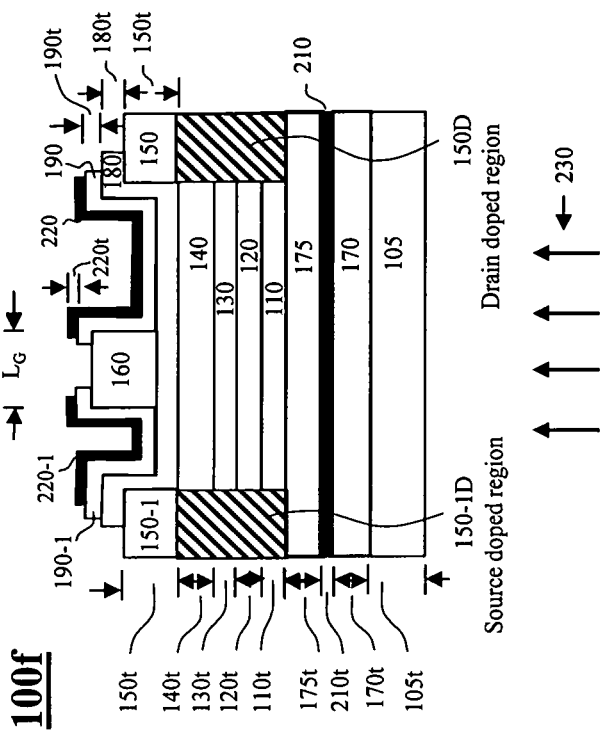
FIG. 1F is a cross-sectional view of a top gate single heterojunction HEM-TFT (100f) showing a first light shield layer (210) of a first light shield layer thickness (210t), a first light shield isolation layer (175) of a first light shield isolation layer thickness (175t), and a second light shield layer (220, 220-1) of a second light shield layer thickness (220t) to prevent light from entering into the active area of the HEM-TFT (100f).
Figure 1E:
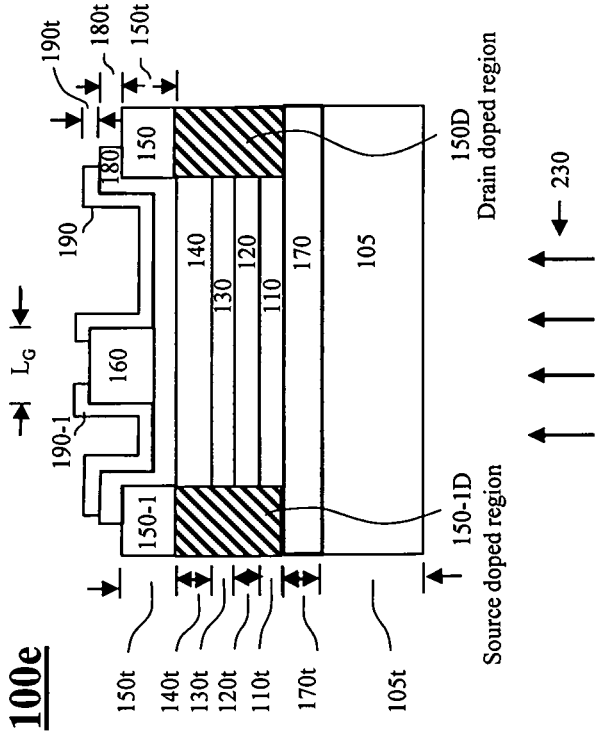
FIG. 1E is a cross-sectional view of a top gate single heterojunction HEM-TFT (100e) showing a first gate insulator layer (180) of a thickness (180t) disposed beneath the first gate (160) and on top of the exposed first barrier layer (140) and parts of the first source (150-1) and the first drain (150) to reduce the current $I_{GS}$ increase the breakdown voltage and to enhance the uniformity during operation of the device (100e) and to increase its lifetime stability.

Therefore, according to one embodiment of this invention, a first light shield layer (210) having a first light shield layer thickness (210t) and a first light shield isolation layer (175) having a first light shield isolation layer thickness (175t) are added in the top gate single heterojunction HEM-TFT (100e) to form a top gate single heterojunction HEM-TFT (100f) as shown in FIG. 1F. The first light shield layer (210) and the first light shield isolation layer (175) are disposed between the substrate barrier layer (170) and the first channel layer (110) and covers the entire top surface of the substrate barrier layer. The purpose of the first light shield layer (210) is to prevent the backside light (230) from reaching the first channel layer (110), the first spacer layer (120), the first doped layer (130) and the first barrier layer (140). The HEM-TFT (100f) also composes of a second light shield layer (220, 220-1) with a second light shield layer thickness ($220t$) disposed over the top surface of the surface passivation layer ($190$, $190$-$1$). The purpose of the second light shield layer ($220$, $220$-$1$) is to prevent the front-side light ($240$) from reaching the first channel layer, the first spacer layer, the first doped layer and the first barrier layer.

Figure 2F:
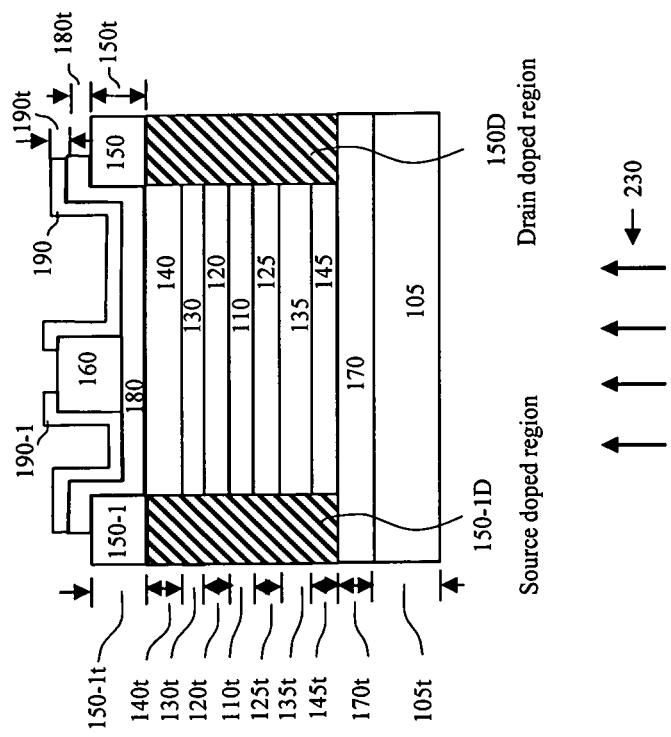
FIG. 2F is a cross-sectional view of a top gate double heterojunction HEM-TFT (200f) showing a first light shield layer (210) of a first light shield layer thickness (210t), a first light shield isolation layer (175) of a first light shield isolation layer thickness (175t), and a second light shield layer (220, 220-1) of a second light shield layer thickness (220t) to prevent light from entering into the active area of the top gate double heterojunction HEM-TFT (200f).

According to another embodiment of this invention, a first light shield layer ($210$) having a first light shield layer thickness ($210t$) and a first light shield isolation layer ($175$) having a first light shield isolation layer thickness ($175t$) are added in the top gate double heterojunction HEM-TFT ($200e$) to form a top gate double heterojunction HEM-TFT ($200f$) as shown in FIG. 2F. The first light shield layer ($210$) and the first light shield isolation layer ($175$) are disposed between the substrate barrier layer ($170$) and the second barrier layer ($145$) and covers the entire surface of the substrate barrier layer. The purpose of the first light shield layer ($210$) is to prevent the backside light ($240$) from reaching the first channel layer ($110$), the first/second spacer layers ($120$, $125$), the first/second doped layers ($130$, $135$) and the first/second barrier layers ($140$, $145$). The HEM-TFT ($200f$) also composes of a second light shield layer ($220$, $220$-$1$) with a second light shield layer thickness ($220t$) disposed over the top surface of the surface passivation layer ($190$, $190$-$1$). The purpose of the second light shield layer ($220$, $220$-$1$) is to prevent the front-side light ($240$) from reaching the first channel layer, the first/second spacer layers, the first/second doped layers and the first/second barrier layers.

Materials for the first light shield layer ($210$) and materials for the second light shield layer ($220$, $220$-$1$) may be selected from a group of metals, including but not limited to: Ti, Ge, In, Hf, Al, Ni, Pt, Co, Pd, Mo, Ta, W, Cu, Ag, Au and their alloys. The first light shield layer thickness ($210t$) is selected to be in a range of 30-200 nm, to sufficiently block the backside light ($230$). The second light shield layer thickness ($220t$) is also selected to be near 30-200 nm, to sufficiently prevent the front-side light ($240$) from entering the active area of the high electron mobility thin film transistors ($100f$, $200f$). Materials of the first light shield isolation layer ($175$) is selected from a group including but not limited to: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, SrO, ScO, $Y_2O_3$, LaO, LuO, ZnN, InN, GaN, SnN, AlN, HfN, ZrN, TiN, CaN, MgN, SiN, BN, BaN, TaN, MoN, WN, GdN, SrN, ScN, YN, LaN, LuN, ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures.

Figure 3A:
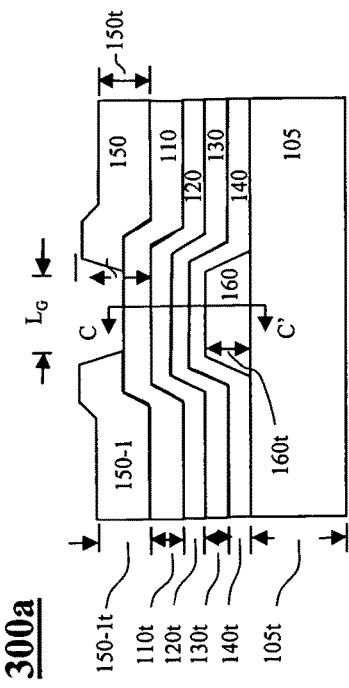
FIG. 3A shows a cross-sectional view of a bottom gate single heterojunction HEM-TFT (300a), wherein the first channel layer (110) is made of metal oxides, metal nitrides or metal oxynitrides.

Bottom Gate Single Heterojunction HEM-TFTs:

According to one embodiment of the present invention, a bottom gate single heterojunction high electron mobility thin film transistor ($300a$) as shown in FIG. 3A is provided. It comprises a substrate ($105$) having a substrate thickness ($105t$) and a substrate energy gap $E_{g105}$; a first gate ($160$) having a first gate work function $\phi_{160}$ (see FIG. 3B), a first gate length $L_G$ and a first gate thickness ($160t$); a first barrier layer ($140$) having a first barrier layer thickness ($140t$), a first barrier layer electron affinity $\chi_{140}$ and a first barrier layer conduction band minimum $CBM_{140}$ (FIG. 3B); a first doped layer ($130$) with a first doped layer thickness ($130t$), containing first doped layer impurity atoms with a first doped layer impurity concentration $N_{130}$, a first doped layer electron affinity $\chi_{130}$, a first doped layer $CBM_{130}$ (FIG. 3B) and a first doped layer charge carrier mobility $\mu_{130}$; a first spacer layer ($120$) with a first spacer layer thickness ($120t$), a first spacer layer $CBM_{120}$ and a first spacer layer electron affinity $\chi_{120}$ (FIG. 3B); a first channel layer ($110$) having a first channel layer thickness ($110t$), a first channel layer electron affinity $\chi_{110}$, a first channel layer conduction band minimum $CBM_{110}$ (FIG. 3B) and a first channel layer free charge carrier mobility $\mu_{110}$, forming a single heterojunction between the first barrier layer ($140$) and the first channel layer ($110$). The HEM-TFT ($300a$) also comprises a first source ($150$-$1$) with a first source thickness ($150$-$1t$); a first drain ($150$) with a first drain thickness ($150t$) contacting a part of the first channel layer ($110$), forming a bottom gate single heterojunction HEM-TFT ($300a$).

The material of the first channel layer ($110$) is selected from a group of metal oxides, metal oxynitrides and metal nitrides. The first channel layer ($110$) is preferably without intentional doping or has a low first channel doping concentration and defect density to minimize unwanted scattering effect, due to impurity ions and defect centers, on the first channel charge carriers and the first channel layer free charge carrier mobility $\mu_{110}$.

Figure 3B:
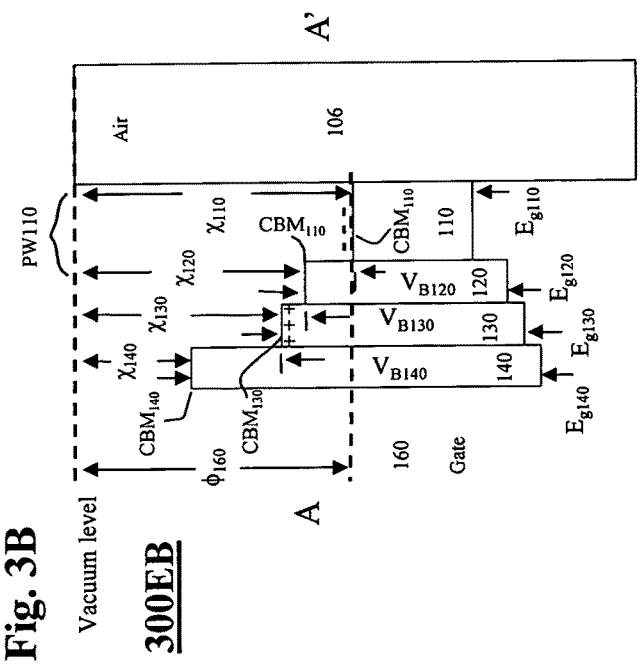
FIG. 3B shows a simplified energy band diagram (300EB) of the bottom gate single heterojunction HEM-TFT (300a) taken along line C-C' in FIG. 3A.

A simplified energy band diagram ($300EB$) of the bottom gate single heterojunction HEM-TFT ($300a$) taken along line C-C' in FIG. 3A and shown in FIG. 3B may be used to understand the electronic structure of the bottom gate single heterojunction HEM-TFT ($300a$). For the single heterojunction HEM-TFT ($300a$) to function, the first channel layer electron affinity $\chi_{110}$ is greater than the first doped layer electron affinity $\chi_{130}$, the first spacer layer electron affinity $\chi_{120}$ and the first barrier layer electron affinity $\chi_{140}$, forming a first potential well (PW$110$) in the first channel layer ($110$) and between the first spacer layer ($120$) and the air ($106$). In an n-type first doped layer ($130$), electrons thermally excited from the first doped layer with a first doped layer impurity concentration $N_{130}$ form first doped layer free charge carriers $n_{130}$ with a first doped layer electron mobility $\mu_{130}$. When the first doped layer free charge carriers $n_{130}$ are remained in the first doped layer ($130$), the first doped layer electron mobility μBo has a reduced value due to ion scatterings. Due to proximity and field effects, the first doped layer free charge carriers $n_{130}$ will flow and drop into the first potential well (PW$110$) to form first channel layer free charge carriers (− − −) with a first channel layer free charge carrier density $n_{110}$, a first channel layer free charge carrier sheet density $n_{S110}$, and a first channel layer electron mobility $\mu_{110}$. This leaves behind the first doped layer impurity ions (+ + +) with a first doped layer impurity concentration $N_{130}$ in the first doped layer ($130$). Therefore, the first doped layer impurity ions (+ + +) and the first channel layer free charge carriers (− − −) are separated by the first spacer layer ($120$) to minimize interactions between them and to reduce unwanted ion scattering and to obtain a high first channel layer electron mobility Hence, the first channel layer electron mobility $\mu_{110}$ is much higher than the first doped layer electron mobility $\mu_{130}$. In prior art technology, conventional TFTs are devoid of the first spacer layer ($120$) introduced by the present invention, charge carriers in the channels of these conventional TFTs have a reduced mobility due to the unwanted impurity scattering.

Without applying a gate voltage $V_{GS}$ between the first gate ($160$) and the first source ($150$-$1$), the first channel layer free charge carrier density $n_{110}$, and the first channel layer free charge carrier sheet density $n_{S110}$ are determined by the relative value of the first gate work function $\phi_{160}$, the first channel layer electron affinity $\chi_{110}$, and properties of the first spacer layer ($120$) including first spacer layer thickness ($120t$). When the first channel layer free charge carriers are electrons, the adoption of a first gate with the gate work function $\phi_{160}$ substantially larger than $\chi_{110}$ would result in a small or low first channel layer electron sheet density $n_{S110}$.

Conversely, a smaller first gate work function $\phi_{160}$ would result in a large first channel layer electron sheet density $n_{S110}$. When a gate voltage ($V_{GS}$) with varied values is applied between the first gate (160) and the first source (150-1), the first channel layer electron density $n_{110}$ in the first channel layer (110) or the first potential well (PW110) will be varied, causing regulations of the first channel layer resistivity $\rho_{110}$ and the first channel layer resistance between the first source (150-1) and the first drain (150).

A drain voltage $V_{DS}$ applied between the first drain (150) and the first source (150-1) effects a flow of charge carriers (or electrons) in the first channel layer (110) from the first source (150-1) to the first drain (150) to form a first drain current $I_{DS}$. During operation, any unwanted first gate current $I_{GS}$ flowing from the first gate to the first source should be kept as small as possible. It is noted that the polarity of the gate voltage may be reversed to effect the modulation of the first channel layer free charge carriers (- - -).

When the doping of the first doped layer (130) is changed from n-type to p-type, the first doped layer free charge carriers $n_{130}$ and the first channel layer free charge carriers will be positive holes instead of negative electrons. Under such conditions, the polarity of $V_{GS}$ and $V_{DS}$ are reversed during operation as compared to the HEM-TFT with a n-type first doped layer (130). To simplify the description, the gate voltage $V_{GS}$ and the drain voltage $V_{DS}$ will not be shown in the subsequent figures.

In certain applications such as electron displays, the present high electron mobility thin film transistors may need to have a dual gate, with a first gate and an additional second gate placed slightly apart and preferably in parallel. The dual grate structure will improve the operation reliability. For simplicity of descriptions, the present invention will be presented using a single gate structure.

Figure 4B:
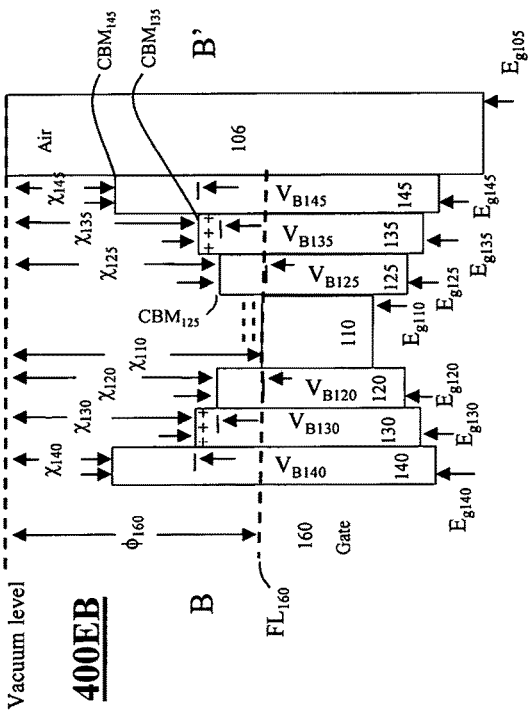
FIG. 4B shows a simplified energy band diagram (400EB) of the bottom gate double heterojunction HEM-TFT (400a) taken along line D-D' in FIG. 4A.
Figure 4A:
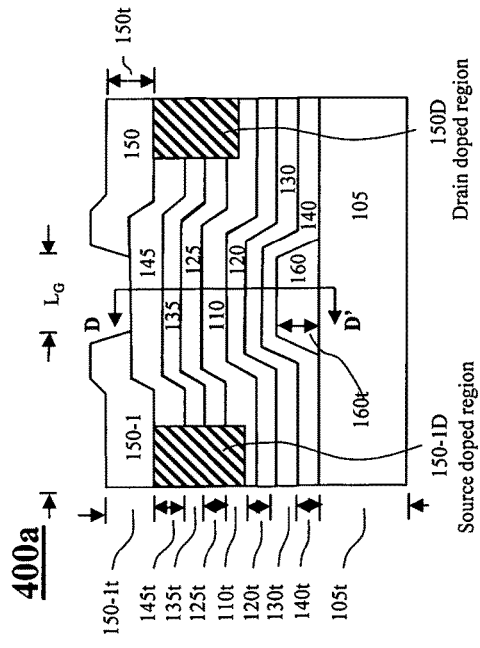
FIG. 4A shows a cross-sectional view of a bottom gate double heterojunction HEM-TFT (400a), wherein the first channel layer (110) is made of metal oxides, metal nitrides or metal oxynitrides.

Bottom Gate Double Heterojunction HEM-TFTs:

According to one embodiment of the present invention, a bottom gate double heterojunction high electron mobility thin film transistor (400a) as shown in FIG. 4A is provided. It comprises a substrate (105) having a substrate thickness (105t) with a substrate energy gap $E_{g105}$; a first gate (160) having a first gate work function $\phi_{160}$ (see FIG. 4B), a first gate length $L_G$ and a first gate thickness (160t); a first barrier layer (140) having a first barrier layer thickness (140t) and a first barrier layer electron affinity $\chi_{140}$, a first barrier layer conduction band minimum $CBM_{140}$ (FIG. 4B); a first doped layer (130) with a first doped layer thickness (130t), containing first doped layer impurity atoms with a first doped layer impurity concentration $N_{130}$, a first doped layer electron affinity $\chi_{130}$, a first doped layer $CBM_{130}$ (FIG. 4B) and a first doped layer charge carrier mobility $\mu_{130}$; a first spacer layer (120) with a first spacer layer thickness (120t), a first spacer layer $CBM_{120}$ and a first spacer layer electron affinity $\chi_{120}$ (FIG. 4B); a first channel layer (110) having a first channel layer thickness (110t), a first channel layer electron affinity $\chi_{110}$, a first channel layer $CBM_{110}$ (FIG. 4B) and a first channel layer free charge carrier mobility $\mu_{110}$, forming a first heterojunction between the first barrier layer (140) and the first channel layer (110).

This bottom gate double heterojunction HEM-TFT (400a) also comprises a second spacer layer (125) with a second spacer layer thickness (125t), a second spacer layer $CBM_{125}$ and a second spacer layer electron affinity $\chi_{125}$ (FIG. 4B) contacting the first channel layer (110); a second doped layer (135) with a second doped layer thickness (135t), containing second doped layer impurity atoms with a second doped layer impurity concentration $N_{135}$, a second doped layer electron affinity $\chi_{135}$, a second doped layer $CBM_{135}$ (FIG. 4B) and a second doped layer mobility $\mu_{135}$; a second barrier layer (145) with a second barrier layer thickness (145t), a second barrier layer electron affinity $\chi_{145}$ and a second barrier layer $CBM_{145}$ (FIG. 4B), forming a second heterojunction between the second barrier layer (145) and the first channel layer (110). This HEM-TFT (400a) also comprises a first source (150-1) with a first source thickness (150-1t) and a first drain (150) with a first drain thickness (150t) to complete a bottom gate double heterojunction HEM-TFT.

In order to minimize unwanted resistance between the first source (150-1) and the first channel layer (110), and between the first drain (150) and the first channel layer (110), a first source doped region (150-1D) and a first drain doped region (150D) are adopted as shown in FIG. 4A. The first source doped region (150-1D) and the first drain doped region (150D) are formed to have a high first source doped region concentration and a high first drain doped region concentration.

The material of the first channel layer (110) is selected from a group of metal oxides, metal oxynitrides and metal nitrides. The first channel layer (110) is preferably without intentional doping or has a low first channel doping concentration and defect density to minimize unwanted scattering effect due to impurity ions and defect centers on the first channel charge carriers and the first channel layer free charge carrier mobility $\mu_{110}$.

A simplified energy band diagram (400EB) of the bottom gate double heterojunction HEM-TFT (400a) taken along line D-D' in FIG. 4A is shown in FIG. 4B. For the present bottom gate double heterojunction HEM-TFT to function, the first channel layer electron affinity $\chi_{110}$ is greater than the first doped layer electron affinity $\chi_{130}$, the first spacer layer electron affinity $\chi_{120}$, the first barrier layer electron affinity $\chi_{140}$, the second doped layer electron affinity $\chi_{135}$, the second spacer layer electron affinity $\chi_{125}$ and the second barrier layer electron affinity $\chi 145$, forming a first potential well (PW110) in the first channel layer (110) between the first spacer layer (120) and the second spacer layer (125).

In an n-type first doped layer (130), electrons thermally excited from the first doped layer (130) with an impurity concentration $N_{130}$ form a first doped layer free charge carriers $n_{130}$ with a first doped layer electron mobility $\mu_{130}$. These first doped layer free charge carriers $n_{130}$ when remained in the first doped layer will have a reduced first doped layer electron mobility $\mu_{130}$ due to an ion scattering. Owing to proximity and field effects, the first doped layer free charge carriers $n_{130}$ will flow and drop into the first potential well (PW110) to form a part I of the first channel layer free charge carriers (- - -) with a first channel layer free charge carrier density part I $n_{110\text{-}1}$, a first channel layer free charge carrier sheet density part I $n_{S110\text{-}1}$, and a first channel layer free charge carrier mobility $\mu_{110}$. This leaves behind the first doped layer impurity ions (+++) of a first doped layer impurity concentration $N_{130}$ in the first doped layer (130). Therefore, the first doped layer impurity ions (+ + +) and part I of the first channel layer free charge carriers (- - -) are separated by the first spacer layer (120) to minimize interactions between them and to reduce unwanted ion scattering and to obtain a high first channel electron mobility $\mu_{110}$. Hence, the first channel layer electron mobility $\mu_{110}$ is much higher than the first doped layer electron mobility $\mu_{130}$.

In an n-type second doped layer (135), electrons thermally excited from the second doped layer (135) with a second doped layer impurity concentration $N_{135}$ form a second doped layer free charge carriers $n_{135}$ with a second doped layer electron mobility $\mu_{135}$. These second doped layer free charge carriers $n_{135}$ when remained in the second doped layer (135) will have a reduced second doped layer electron mobility $\mu_{135}$ due to an ion scattering. Owing to proximity and field effects, the second doped layer free charge carriers $n_{135}$ will flow and drop into the first potential well (PW110) to form a part II of the first channel layer free charge carriers (- - -) with a first channel layer free charge carrier density part II $n_{110-2}$, a first channel layer free charge carrier sheet density part II $n_{S110-2}$, and a first channel layer free charge carrier mobility $\mu_{110}$. This leaves behind second doped layer impurity ions (+ + +) of a second doped layer impurity concentration $N_{135}$ in the second doped layer (135). Therefore, the second doped layer impurity ions (+ + +) and part II of the first channel layer free charge carriers (- - -) are separated by the second spacer layer (125) to minimize interactions between them and to reduce unwanted ion scattering and to obtain a high first channel layer electron mobility $\mu_{110}$. Hence, the first channel layer electron mobility $\mu_{110}$ is much higher than the second doped layer electron mobility $\mu_{135}$.

The first channel layer free charge carrier density $n_{110}$ is equal to the sum of the first channel layer free charge carrier density part I $n_{110-1}$ and the first channel layer free charge carrier density part II $n_{110-2}$: $n_{110}=n_{110-1}+n_{110-2}$ and it is larger than that when a bottom gate single heterojunction structure is employed. The first channel layer free charge carrier sheet density $n_{S110}$ is equal to the sum of the first channel layer free charge carrier sheet density part I $n_{S110-1}$ and the first channel layer free charge carrier sheet density part II $n_{S110-2}$: $n_{S110}=n_{S110-1}+n_{S110-2}$ and is larger than when a bottom gate single heterojunction structure is employed.

Without applying a gate voltage $V_{GS}$ (not shown), the first channel layer free charge carrier density $n_{110}$, and the first channel layer free charge carrier sheet density $n_{S110}$ are determined by the relative value of the first gate work function $\phi_{160}$, the first channel layer electron affinity $\mu_{110}$, and properties of the first/second spacer layers including first/second spacer layer thickness (120t, 125t). When the first channel layer free charge carriers are negative electrons, the adoption of a first gate with the gate work function $\phi_{160}$ substantially larger than $\chi_{110}$ would result in a small or low first channel layer electron sheet density $n_{S110}$. Conversely, a smaller first gate work function $\phi_{160}$ would result in a large first channel layer electron sheet density $n_{S110}$. When a gate voltage ($V_{GS}$) with varied values is applied between the first gate (160) and the first source (150-1), the first channel layer electron sheet density $n_{110}$ in the first channel layer or the first potential well (PW110) will be varied, causing regulations of the first channel layer resistivity $\rho_{110}$ and hence the first channel layer resistance between the first source (150-1) and the first drain (150).

A drain voltage $V_{DS}$ (not shown) applied between the first drain (150) and the first source (150-1) effects a flow of charge carriers (or electrons) in the first channel layer (110) from the first source to the first drain to form a first drain current $I_{DS}$. During operations, any unwanted first gate current $I_{GS}$ flowing from the first gate to the first source should be kept as small as possible. It is noted that the polarity of the gate voltage may be reversed to effect the modulation of the first channel layer free charge carriers (- - -).

When the doping of the first/second doped layers (130, 135) is changed from n-type to p-type, the first doped layer free charge carriers $n_{130}$ and part I of the first channel layer free charge carriers, the second doped layer free charge carriers $n_{135}$ and part II of the first channel layer free charge carriers will be positive holes instead of negative electrons.

Under such conditions, the polarity of the first gate to first source voltage $V_{GS}$ and the first drain to first source voltage $V_{DS}$ are reversed during operation as compared to the HEM-TFTs with a n-type first/second doped layers (130, 135) and electrons in the first channel layer (110). To simplify the description, the gate voltage $V_{GS}$ and the drain voltage $V_{DS}$ were shown in the figures.

In certain applications such as electron displays, the present high electron mobility thin film transistors may need to have a dual gate, with a first gate and an additional second gate placed slightly apart and preferably in parallel. The dual grate structure will improve the operation reliability. For simplicity of descriptions, the present invention will be presented using a single gate structure.

Materials, Thickness and Properties of the Bottom Gate HEM-TFTs:

Substrate (105):

The substrate (105) in the bottom gate HEM-TFTs may be selected from a material group including: glass sheets, plastic sheets such as PET, PEN, PC, metal sheets and Si substrate. The substrate thickness (105t) is preferably selected to be 1 mm or less and is more preferably to be 100 µm or less with a substrate energy gap $Eg_{105}$ as large as possible. For RF applications, the substrate thickness requires to have a very precise control to within +/−1 µm. The exact substrate thickness will be determined by the transmission line impedance, usually 50 ohm.

First Channel Layer (110):

According to one embodiment of this invention, materials of the first channel layer (110) in the bottom gate HEM-TFTs are selected from a group of metal oxides, including but not limited to: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, SrO, ScO, $Y_2O_3$, LaO, LuO and their mixtures.

According to another embodiment of the invention, materials of the first channel layer (110) are selected from a group of metal oxynitrides, including but not limited to: ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures.

According to one other embodiment of this invention, materials of the first channel layer (110) are selected from a group of metal nitrides, including but not limited to: ZnN, InN, GaN, SnN, AlN, HfN, ZrN, TiN, CaN, MgN, SiN, BN, BaN, TaN, MoN, WN, GdN, SrN, ScN, YN, LaN, LuN and their mixtures.

The first channel layer thickness (110t) is selected to be in a range of 1 to 200 nm, and is more preferably to be in a range of 1 to 100 nm. In order to obtain high first channel layer mobility $\mu_{110}$ for a low ON state resistance and a very high OFF state resistance, the first channel layer (110) is preferably undoped or lightly doped so that it has a low ion concentration to minimize unwanted ion scattering and it has a low defect density to reduce charge carrier trapping and scattering.

The electron affinity $\chi$ of a given substance is the difference between the vacuum level and the conduction band minimum CBM. As shown in FIGS. 3B and 4B, the first channel layer (110) which may be a metal oxide, a metal oxynitride or metal nitride, has a first channel layer electron affinity $\chi_{110}$ and first channel layer energy gap $E_{g110}$, and a first channel layer conduction band minimum $CBM_{110}$. The elemental composition of the first channel layer is selected so that the first channel layer electron affinity $\chi_{110}$ has a value close to 4 eV or slightly larger.

First and Second Spacer layers (120, 125):

According to one embodiment of the invention, materials of the first spacer layer (120) and the second spacer layer (125) in the bottom gate HEM-TFTs may be selected from a group of metal oxides, including but not limited to: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO WO, GdO, $Sr_2O_3$, ScO, $Y_2O_3$, LaO, LuO and their mixtures. The materials of the first spacer layer (120) and the second spacer layer (125) may also be selected from a group of metal oxynitrides, including but not limited to: ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The materials of the first spacer layer (120) and the second spacer layer (125) may still be selected from a group of metal nitrides, including but not limited to: ZnN, InN, GaN, SnN, AlN, HfN, ZrN, TiN, CaN, MgN, SiN, BN, BaN, TaN, MoN, WN, GdN, SrN, ScN, YN, LaN, LuN and their mixtures.

The first spacer layer thickness (120t) and the second spacer layer thickness (125t) are selected to be in a range of 0.3 to 5 nm, and are more preferably selected to be in a range of 0.5 to 2 nm to facilitate charge carrier separation from the first doped layer (130) and the second doped layer (135). The first spacer layer and the second spacer layer are preferably undoped or lightly doped so that it has a low charge carrier density and a low density of ionized impurities or defect centers to minimize unwanted ion scattering and trapping of charge carriers.

For a bottom gate single heterojunction HEM-TFT (such as 300a), the elemental composition of the first spacer layer (120) is selected so that the first spacer layer electron affinity $\chi_{120}$ has a value less than the first channel layer electron affinity $\chi_{110}$. The difference between the first spacer layer electron affinity $\chi_{120}$ and the first channel layer electron affinity $\chi_{110}$ should be large enough to facilitate formation of the first potential well PW110 and to prevent first channel layer charge carriers from escaping through the first spacer layer during operation. It is also preferred to have the first spacer layer energy gap $E_{g120}$ larger than the first channel layer energy gap $E_{g110}$.

For a bottom gate double heterojunction HEM-TFT (such as 400a), the elemental compositions of the first spacer layer (120) and the second spacer layer (125) are selected so that the first spacer layer electron affinity $\chi_{120}$ and second spacer layer electron affinity $\chi_{125}$ have values less than the first channel layer electron affinity $\chi_{110}$. The difference between the first spacer layer electron affinity $\chi_{120}$ and the first channel layer electron affinity $\chi_{110}$, and the difference between the second spacer layer electron affinity $\chi_{125}$ and the first channel layer electron affinity $\chi_{110}$ should be large enough to facilitate formation of the first potential well PW110 and to prevent first channel layer charge carriers from escaping through the first spacer layer and the second spacer layer during operation. It is also preferred to have the first spacer layer energy gap $E_{g120}$ and second spacer layer energy gap $E_{g125}$ larger than the first channel layer energy gap $E_{g110}$.

First and Second Doped Layer (130, 135):

For the bottom gate single heterojunction HEM-TFTs, materials of the first doped layer (130) may be selected from a group of metal oxides including: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, $Sr_2O_3$, ScO, $Y_2O_3$, LaO, LuO and their mixtures. The materials of the first doped layer (130) may also be selected from a group of metal oxynitride including: ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The materials of the first doped layer (130) may still be selected from a group of metal nitrides including: ZnN, InN, GaN, SnN, AlN, HfN, ZrN, TiN, CaN, MgN, SiN, BN, BaN, TaN, MoN, WN, GdN, SrN, ScN, YN, LaN, LuN and their mixtures.

In a bottom gate single heterojunction HEM-TFT such as (300a), the first doped layer thickness (130t) is selected to be in a range of 0.5 to 50 nm, and is more preferably selected to be in a range of 0.5 to 2 nm. The first doped layer is preferably highly doped so that it has a high first doped layer impurity concentration $N_{130}$ and a high density of first doped layer impurity ion concentration. The first doped layer impurity concentration $N_{130}$ is preferably larger than $10^{18}$ $cm^{-3}$ and is more preferably larger than $10^{19}$ $cm^{-3}$ so that a first doped layer sheet impurity concentration $S_{130}$ which is equal to $N_{130} \times 130t$, is preferably greater than $10^{12}$ $cm^{-2}$ and more preferably greater than $10^{13}$ $cm^{-2}$. And the first channel layer free charge carrier sheet density $n_{S110}$ which is equal to $n_{110} \times 100t$ is preferably greater than $10^{12}$ $cm^{-2}$ and more preferably greater than $10^{13}$ $cm^{-2}$.

For the bottom gate single heterojunction HEM-TFTs, the elemental composition of the first doped layer (130) is selected so that the first doped layer electron affinity $\chi_{130}$ has a value equal to or smaller than the first spacer layer electron affinity $\chi_{120}+kT$, where kT is the thermal energy of the first doped layer charge carriers, k is the Boltzman constant and T is the temperature. The selection of the first doped layer electron affinity $\chi_{130}$ should allow most of the first doped layer free charge carriers $n_{130}$ to flow to the first potential well PW110 in first channel layer (110), so that $n_{110} \approx n_{130}$.

For the bottom gate double heterojunction HEM-TFTs, materials of the first doped layer (130) and materials of the second doped layer (135) may be selected from a group of metal oxides, including: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, $Sr_2O_3$, ScO, $Y_2O_3$, LaO, LuO and their mixtures. The materials of the first doped layer (130) and materials of the second doped layer (135) may also be selected from a group of metal oxynitrides, including: ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The materials of the first doped layer (130) and materials of the second doped layer (135) may still be selected from a group of metal nitrides, including: ZnN, InN, GaN, SnN, AlN, HfN, ZrN, TiN, CaN, MgN, SiN, BN, BaN, TaN, MoN, WN, GdN, SrN, ScN, YN, LaN, LuN and their mixtures.

In the bottom gate double heterojunction HEM-TFTs, the first doped layer thickness (130t) and the second doped layer thickness (135t) are selected to be in a range of 0.5 to 50 nm, and are more preferably to be in a range of 0.5 to 2 nm. The first doped layer (130) and the second doped layer (135) are preferably highly doped so that they have a high first doped layer impurity concentration $N_{130}$ and a high second doped layer impurity concentration $N_{135}$, and also a high density of first doped layer impurity ion concentration and a high density of second doped layer impurity ion concentration. The first doped layer impurity concentration $N_{130}$ is preferably larger than $10^{18}$ $cm^{-3}$ and more preferably larger than $10^{19}$ $cm^{-3}$, so that a first doped layer sheet impurity concentration $S_{130}$ which is equal to $N_{130} \times 130t$, is greater than $10^{12}$ $cm^{-2}$ and more preferably greater than $10^{13}$ $cm^{-2}$. And the first channel layer free charge carrier sheet density part I $n_{S110-1}$ which is equal $n_{110-1} \times 110t$ is greater than $10^{12}$ $cm^{-2}$ and more preferably greater than $10^{13}$ $cm^{-2}$. The second doped layer impurity concentration $N_{135}$ is preferably larger than $10^{18}$ cm$^{-3}$ and more preferably greater than $10^{19}$ cm$^{-3}$, so that a second doped layer sheet impurity concentration $S_{135}$ which is equal to $N_{135} \times 135t$, is greater than $10^{12}$ cm$^{-2}$ and more preferably greater than $10^{13}$ cm$^{-2}$. And the first channel layer free charge carrier sheet density part II $n_{S110-2}$ which is equal $n_{110-2} \times 110t$ is greater than $10^{12}$ cm$^{-2}$ and more preferably greater than $10^{13}$ cm$^{-2}$.

For the bottom gate double heterojunction HEM-TFTs, the elemental composition of the first doped layer (130) is properly selected so that the first doped layer electron affinity $\chi_{130}$ has a value equal to or smaller than the first spacer layer electron affinity $\chi_{120}$ kT, where kT is the thermal energy of the first doped layer charge carriers, k is the Boltzman constant and T is the temperature. The elemental composition of the second doped layer (135) is also properly selected so that the second doped layer electron affinity $\chi_{135}$ has a value no greater than the second spacer layer electron affinity $\chi_{125}$+kT, where kT is the thermal energy of the second doped layer charge carriers. The selection of the first doped layer electron affinity $\chi_{130}$ should allow most of the first doped layer free charge carriers $n_{130}$ to flow to the first potential well PW110 in the first channel layer and selection of the second doped layer electron affinity $\chi_{135}$ should allow most of the second doped layer free charge carriers $n_{135}$ to flow to the first potential well PW110, so that $n_{110} \; n_{130}+n_{135}$. It is also preferred to have the first doped layer energy gap $E_{g130}$ and second doped layer energy gap $E_{g135}$ substantially close to the first spacer layer energy gap $E_{g120}$.

Doping of the first doped layer (130) and the second doped layer (135) may be achieved by intrinsic doping including adjusting the oxygen vacancies and/or the nitrogen vacancies, or by extrinsic doping through adding of impurities. The intrinsic doping may be achieved by adjusting the metal to oxygen and/or nitrogen ratios during manufacturing. For the extrinsic doping of the first doped layer and the second doped layer, various elements selected from the following doping material group may be adopted: Sb, F, As, Nb, Ta, Al, Ga, B, In, Y, Sc, V, Si, Ge, Ti, Zr, Hf, Mg, As, H, Sn, Mo, W, Zr, and F.

First and Second Barrier Layers (140, 145):

For the bottom gate HEM-TFTs with a single heterojunction structure, materials of the first barrier layer (140) may be selected from a group of metal oxides, including: ZnO, In$_2$O$_3$, Ga$_2$O$_3$, SnO, Al$_2$O$_3$, HfO$_2$, ZrO$_2$, TiO$_2$, CaO, MgO, SiO$_2$, B$_2$O$_3$, BaO, TaO, MoO, WO, GdO, Sr$_2$O$_3$, ScO, Y$_2$O$_3$, LaO, LuO and their mixtures. The materials of the first barrier layer (140) may also be selected from a group of metal oxynitrides, including: ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The materials of the first barrier layer (140) may still be selected from a group of metal nitrides, including: ZnN, InN, GaN, SnN, CaN, MgN, ZrN, HfN, BN, AlN, TiN, TaN, LaN, LuN, YN, SiN, BaN, Sr ZnN, InN, GaN, SnN, AlN, HfN, ZrN, TiN, CaN, MgN, SiN, BN, BaN, TaN, MoN, WN, GdN, SrN, ScN, YN, LaN, LuN and their mixtures.

In the bottom gate single heterojunction HEM-TFTs, the first barrier layer thickness (140*t*) is preferably to be in a range of 0.5 to 50 nm, and it is more preferably to be in a range of 1 to 20 nm. The exact value of the first barrier layer thickness is selected by the modulation effects of the first gate (160) on the first channel layer free charge carrier density $n_{110}$, threshold voltage and the constraint for unwanted first gate current $I_{GS}$ during the operation. The first barrier layer is preferably undoped and having a large first barrier layer band gap $E_{g140}$, so that it has a large electric resistivity and dielectric strength.

For the bottom gate HEM-TFTs with a double heterojunction structure, materials of the first barrier layer (140) and the second barrier layer (145) are selected from a group of metal oxides, including: ZnO, In$_2$O$_3$, Ga$_2$O$_3$, SnO, Al$_2$O$_3$, HfO$_2$, ZrO$_2$, TiO$_2$, CaO, MgO, SiO$_2$, B$_2$O$_3$, BaO, TaO, MoO, WO, GdO, Sr$_2$O$_3$, ScO, Y$_2$O$_3$, LaO, LuO and their mixtures. The materials of the first barrier layer (140) and the second barrier layer (145) may also be selected from a group of metal oxynitrides, including: ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The materials of the first barrier layer (140) and the second barrier layers (145) may still be selected from a material group of metal nitrides, including: ZnN, InN, GaN, SnN, AlN, HfN, ZrN, TiN, CaN, MgN, SiN, BN, BaN, TaN, MoN, WN, GdN, SrN, ScN, YN, LaN, LuN and their mixtures.

In the bottom gate double heterojunction HEM-TFTs, the first barrier layer thickness (140*t*) and the second barrier layer thickness (145*t*) are preferably to be in a range of 0.5 to 50 nm, and are more preferably to be in a range of 1 to 20 nm. The exact value of the first barrier layer thickness (140*t*) and the second barrier layer thickness (145*t*) are selected by the modulation effects of the first gate (160) on the first channel layer free carrier concentration $n_{110}$, the threshold voltage, and the constraint for unwanted first gate current $I_{GS}$ during the operation. The first barrier layer (140) and the second barrier layer (145) are preferably undoped and having a large energy band gap $E_{g140}$ and $E_{g145}$, so that they have a large electric resistivity and a high dielectric strength.

As shown in FIG. 3B for a bottom gate single heterojunction HEM-TFT, the first barrier layer electron affinity $\chi_{140}$ is less than the first doped layer electron affinity $\chi_{130}$. As shown in FIG. 4B for a bottom gate double heterojunction HEM-TFT, the first barrier layer electron affinity $\chi_{140}$ and the second barrier layer electron affinity $\chi_{145}$ are less than the first doped layer electron affinity $\chi_{130}$ and the second doped layer electron affinity $\chi_{135}$.

First Gate, First Source and First Drain (160, 150-1, 150):

In the bottom gate HEM-TFTs such as (300*a*) and (400*a*), the first gate (160) makes contact to the first barrier layer (140) and should create a rectifying contact or an insulated contact in order to effect the modulation of the first channel layer free charge carrier density $n_{110}$ without a large flow of an unwanted first gate current $I_{GS}$. The first gate work function $\phi_{160}$ is determined by the material composition of the first gate contacting the first barrier layer (140) or the first gate insulator layer (180, shown in FIGS. 3E and 4E) and is selected to have a large value, preferably larger than 4.8 eV and more preferably larger than 5 eV for negative first channel layer free charge carriers. A large gate work function $\phi_{160}$ will create a first channel depletion layer under the first gate so that the high electron mobility thin film transistor is in or close to an OFF state without the application of a significant gate voltage $V_{GS}$.

The first gate thickness (160*t*) is selected in a range of 10 to 3000 nm and the first gate length $L_G$ is selected in a range of 5 to 3000 nm. Materials of the first gate (160) are selected from a group including: Ti, Ge, In, Hf, Al, Ni, Pt, Co, Pd, Mo, Ta, W, Cu, Ag, Au and their alloys so that the first gate layer to contact the first barrier layer (140) or the first gate insulator layer (180, in FIGS. 3E and 4E) can form a rectifying Schottky junction or insulated contact (as shown in FIGS. 3E and 4E) for operation.

The first source (150-1) and the first drain (150) in the bottom gate single heterojunction HEM-TFT (300a) as shown in FIG. 3A are directly deposited on the surface of the first channel layer (110) whilst the first source (150-1) and the first source (150) in the bottom gate double heterojunction HEM-TFT (400a) as shown in FIG. 4A are making contact to the first channel layer (110) through the second barrier layer (145), the second doped layer (135) and the second spacer layer (125). Therefore, in order to allow an easy flow of first channel layer free charge carriers from the source (150-1) to the drain (150) in HEM-TFT (400a), the contact between the first source (150-1) and the second barrier layer (145), and the contact between the first drain (150) and the second barrier layer (145) should be ohmic contacts with low unwanted contact resistance. Materials of the first source (150-1) and the first drain (150) are selected from a group including but not limited to: Ti, Ge, In, Hf, Al, Ni, Pt, Co, Pd, Mo, Ta, W, Cu, Ag, Au and their alloys so that the first layer of the first source and the first drain (150-1, 150) can form an ohmic contact with the second barrier layer (145).

The first source doped region (150-1D) and the first drain doped region (150D) in the bottom gate double heterojunction HEM-TFTs are formed to have a high first source doped region concentration and a high first drain doped region concentration, preferably to a level higher than $10^{19}$ cm$^{-3}$ or more preferably to a level higher than $10^{20}$ cm$^{-3}$. These high doping levels reduce the thickness of the depletion layers formed, allowing for easy direct flow or tunneling of charge carriers and decreasing any unwanted contact resistances. Alternately, at regions immediately under the first source and the first drain, material of the second barrier layer (145) may be removed partly or completely before forming or depositing the first source and the first drain, in order to reduce the unwanted contact resistances.

Substrate Barrier Layer (170):

Micro defects or contaminations on the surfaces of the substrate (105) and unwanted penetration of water or oxygen molecules in a plastic substrate can cause defects in the first channel layer, the spacer layer(s), the doped layer(s) and the barrier layer(s), leading to degradation in performance or uniformity of the bottom gate HEM-TFTs such as (300a) and (400a).

Figure 3C:
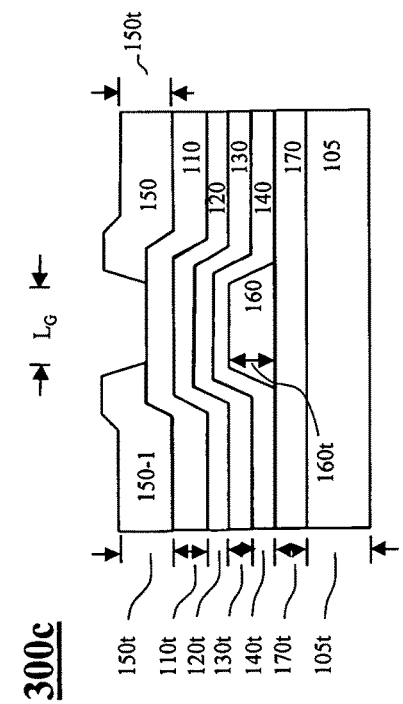
FIG. 3C is a cross-sectional view of a bottom gate single heterojunction HEM-TFT (300c) showing a substrate barrier layer (170) of a thickness (170t) disposed on top of the substrate (105) to minimize effects of micro defects, contaminants, water molecules and oxygen molecules on the substrate and to enhance lifetime stability of the bottom gate single heterojunction HEM-TFT (300c).

Hence, according to one embodiment of the invention, a substrate barrier layer (170) of a substrate barrier layer thickness (170t) is added into the bottom gate single heterojunction HEM-TFT (300a) to form a single heterojunction HEM-TFT (300c) as shown in FIG. 3C. The substrate barrier layer (170) is deposited on top of the substrate (105) and beneath the first gate (160) and the first barrier layer (140) to minimize effects of micro defects, contaminants, water molecules and oxygen molecules on the substrate (105) to enhance lifetime stability of the bottom gate single heterojunction HEM-TFT (300c).

Figure 4C:
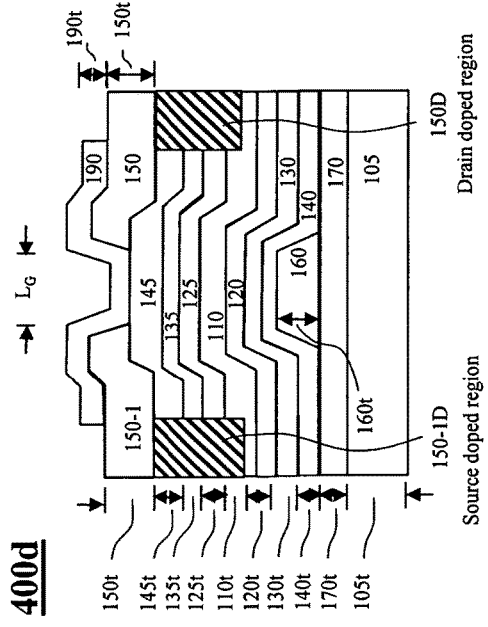
FIG. 4C is a cross-sectional view of a bottom gate double heterojunction HEM-TFT (400c) showing a substrate barrier layer (170) of a thickness (170t) disposed on top of the substrate (105) to minimize effects of micro defects, contaminants, water molecules and oxygen molecules on the substrate and to enhance lifetime stability of the bottom gate double heterojunction HEM-TFT (400c).

According to another embodiment of this invention, a substrate barrier layer (170) of a substrate barrier layer thickness (170t) is added into the double heterojunction HEM-TFT (400a) for form a double heterojunction HEM-TFT (400c) as shown in FIG. 4C. The substrate barrier layer (170) is deposited on top of the substrate (105) and beneath the first gate (160) and the first barrier layer (140) to minimize effects of micro defects, contaminants, water molecules and oxygen molecules on the substrate (105) to enhance lifetime stability of the bottom gate double heterojunction HEM-TFT (400c).

Materials of the substrate barrier layer (170) may be selected from a group of oxides, oxynitrides and nitrides, including but not limited to: ZnO, In$_2$O$_3$, Ga$_2$O$_3$, SnO, Al$_2$O$_3$, HfO$_2$, ZrO$_2$, TiO$_2$, CaO, MgO, SiO$_2$, B$_2$O$_3$, BaO, TaO, MoO, WO, GdO, SrO, ScO, Y$_2$O$_3$, LaO, LuO, ZnN, InN, GaN, SnN, AlN, HfN, ZrN, TiN, CaN, MgN, SiN, BN, BaN, TaN, MoN, WN, GdN, SrN, ScN, YN, LaN, LuN, ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The substrate barrier layer thickness (170t) may be in a range of 5 nm to 10 μm.

Surface Passivation Layer (190):

During operations, HEM-TFTs are often exposed to the room air and unwanted contaminants including molecules of water and oxygen may adhere to the surfaces of the devices and penetrate to the first channel layer to affect or vary the performance of the HEM-TFTs.

Figure 3D:
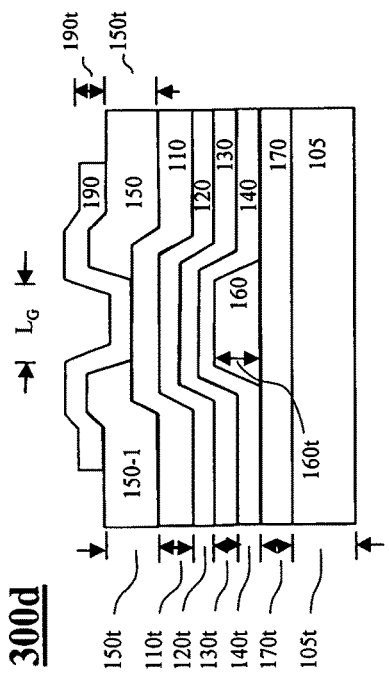
FIG. 3D is a cross-sectional view of a bottom gate single heterojunction HEM-TFT (300d) showing a surface passivation layer (190) of a thickness (190t) disposed on top of the exposed first channel layer (110) and parts of the first source (150-1) and the first drain (150) to protect the bottom gate single heterojunction HEM-TFT (300d) and to increase its lifetime stability.
Figure 3E:
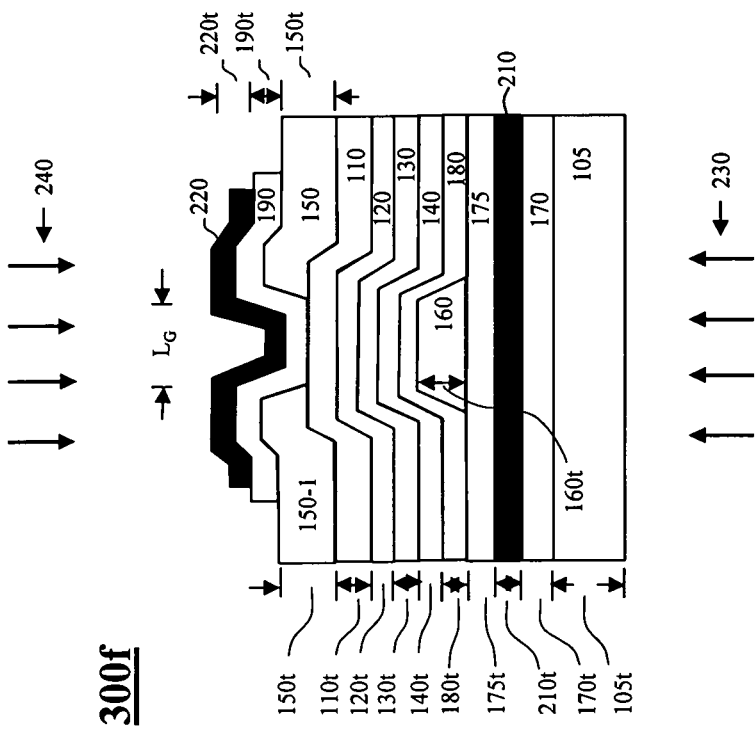
FIG. 3E is a cross-sectional view of a bottom gate single heterojunction HEM-TFT (300e) showing a first gate insulator layer (180) of a thickness (180t) disposed beneath the first barrier layer (140) and on top of the first gate (160) and the substrate barrier layer (170) to reduce the current $I_{GS}$ increase the breakdown voltage and to enhance the uniformity during operation of the device (300e) and to increase its lifetime stability.

According to one embodiment of this invention, a surface passivation layer (190) of a surface passivation layer thickness (190t) is added in the bottom gate single heterojunction HEM-TFT (300c) to form a bottom gate single heterojunction HEM-TFT (300d) as shown in FIG. 3D. The surface passivation layer (190) is disposed on top of the exposed region of the first channel layer (110) and on top of a part of the first source (150-1) and a part of the first drain (150).

Figure 4D:
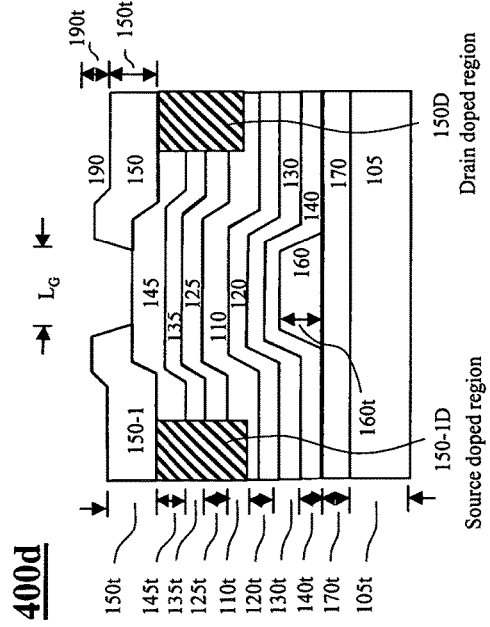
FIG. 4D is a cross-sectional view of a bottom gate double heterojunction HEM-TFT (400d) showing a surface passivation layer (190) of a thickness (190t) disposed on top of the exposed second barrier layer (145) and parts of the first source (150-1) and the first drain (150) to protect the bottom gate double heterojunction HEM-TFT (400d) and to increase its lifetime stability.
Figure 4E:
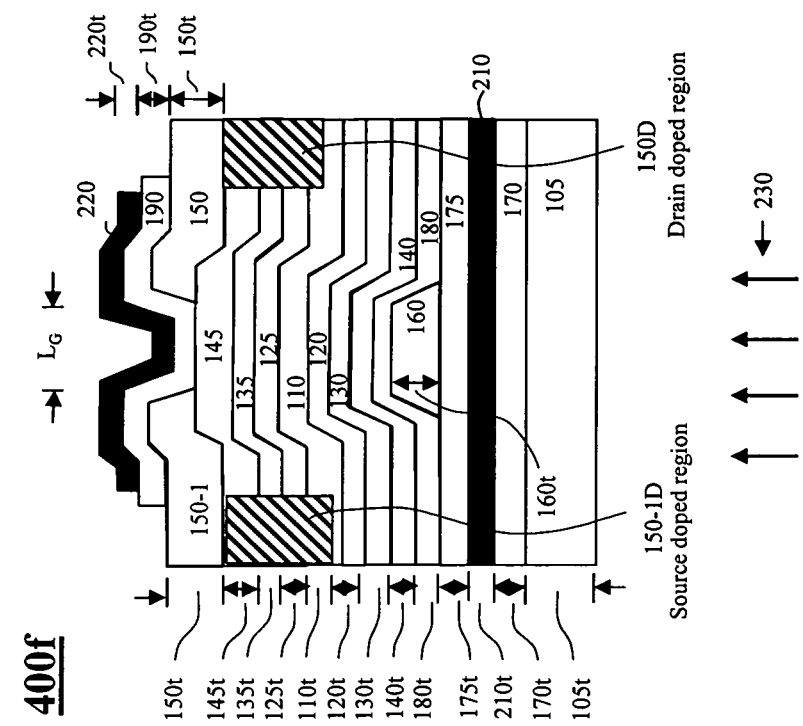
FIG. 4E is a cross-sectional view of a bottom gate double heterojunction HEM-TFT (400e) showing a first gate insulator layer (180) of a thickness (180t) disposed beneath the first barrier layer (140) and on top of the first gate (160) and the substrate barrier layer (170) to reduce the current $I_{GS}$, increase the breakdown voltage and to enhance the uniformity during operation of the device (400e) and to increase its lifetime stability.

According to another embodiment of this invention, a surface passivation layer (190) of a surface passivation layer thickness (190t) is added in the bottom gate double heterojunction HEM-TFT (400c) to form a bottom gate double heterojunction HEM-TFT (400d) as shown in FIG. 4D. The surface passivation layer (190) is disposed on top of the exposed region of the first barrier layer (145) and on top of a part of the first source (150-1) and a part of the first drain (150).

The main purpose of the surface passivation layer (190) is to protect the HEM-TFTs (300d, 400d) and to increase their lifetime stability. Materials of the surface passivation layer (190) may be selected from a group of oxides, oxynitrides and nitrides, including: ZnO, In$_2$O$_3$, Ga$_2$O$_3$, SnO, Al$_2$O$_3$, HfO$_2$, ZrO$_2$, TiO$_2$, CaO, MgO, SiO$_2$, B$_2$O$_3$, BaO, TaO, MoO, WO, GdO, SrO, ScO, Y$_2$O$_3$, LaO, LuO, ZnN, InN, GaN, SnN, AlN, HfN, ZrN, TiN, CaN, MgN, SiN, BN, BaN, TaN, MoN, WN, GdN, SrN, ScN, YN, LaN, LuN, ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The surface passivation layer thickness (190t) may be selected in a range of 20 to 5000 nm.

First Gate Insulator Layer (180):

One of the issues on the thermal stability of operation in HEM-TFT is too large a first gate current $I_{GS}$ or even a breakdown between the first gate and the first source. Steps are provided to reduce these unwanted effects from happening and to ensure the performance uniformity of the HEM-TFTs.

Therefore, according to one embodiment of this invention, a first gate insulator layer (180) of a first gate insulator layer thickness (180t) is added in the bottom gate single heterojunction HEM-TFT (300d) to form a bottom gate single heterojunction HEM-TFT (300e) as shown in FIG. 3E. The first gate insulator layer (180) is situated under the first barrier layer (140) and on top of the first gate (160) and the substrate barrier layer (170).

According to another embodiment of the invention, a first gate insulator layer (180) of a first gate insulator thickness (180t) is added in the bottom gate double heterojunction HEM-TFT (400*d*) for form a bottom gate double heterojunction HEM-TFT (400*e*) as shown in FIG. 4E. The first gate insulator layer (180) is situated under the first barrier layer (140) and on top of the first gate (160) and the substrate barrier layer (170).

The main purpose of the first gate insulator layer (180) is to reduce the first gate current $I_{GS}$, to increase the breakdown voltage and to enhance the uniformity during operation of the devices (300*e* and 400*e*) and to increase their lifetime stability. Materials of the first gate insulator layer (180) may be selected from a group of oxides, oxynitrides and nitrides, including but not limited to: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, SrO, ScO, $Y_2O_3$, LaO, LuO, ZnN, InN, GaN, SnN, AlN, HfN, ZrN, TiN, CaN, MgN, SiN, BN, BaN, TaN, MoN, WN, GdN, SrN, ScN, YN, LaN, LuN, ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures. The first gate insulator layer thickness (180*t*) may be selected in a range of 1 to 300 nm.

First Light Shield Layer and Second Light Shield Layer (210, 220):

When the HEM-TFTs (300*e*, 400*e*) are used in switching circuits for electronic displays, as shown in FIGS. 3E and 4E, there may be constant backside light (230) and front-side light (240). The light (230, 240) is either from internal light sources in the electron displays or from the environment. Part of the light (130, 240) will reach the HEM-TFTs (300*e*, 400*e*) and be absorbed by the first channel layer, the spacer layer(s), the doped layer(s) or even the barrier layer(s). The light absorption will cause excitation of electron-hole pairs and increase the first gate current $I_{GS}$ and first drain current $I_{DS}$. This often leads to increase in power consumption and performance degradation of the devices (300*e*, 400*e*).

Figure 3F:
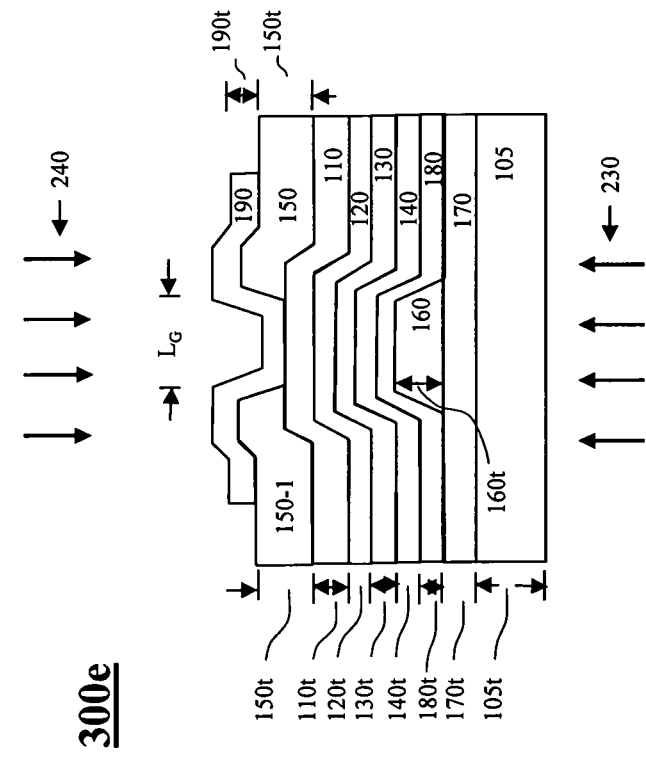
FIG. 3F is a cross-sectional view of a bottom gate single heterojunction HEM-TFT (300f) showing a first light shield layer (210) of a first light shield layer thickness (210t), a first light shield isolation layer (175) of a first light shield isolation layer thickness (175t), and a second light shield layer (220) of a second light shield layer thickness (220t) to prevent light from entering into the active area of the HEM-TFT (300f).

Therefore, according to one embodiment of this invention, a first light shield layer (210) having a first light shield layer thickness (210*t*) and a first light shield isolation layer (175) having a first light shield isolation layer thickness (175*t*) are added in the bottom gate single heterojunction HEM-TFT (300*e*) to form a bottom gate single heterojunction HEM-TFT (300*f*) as shown in FIG. 3F. The first light shield layer (210) and the first light shield isolation layer (175) are disposed on a top surface of the substrate barrier layer (170) and cover the entire top surface of the substrate barrier layer. The purpose of the first light shield layer (210) is to prevent the backside light (230) from reaching the first channel layer (110), the first spacer layer (120), the first doped layer (130) and the first barrier layer (140). The HEM-TFT (3001) also composes a second light shield layer (220) with a second light shield layer thickness (220*t*) disposed over the top surface of the surface passivation layer (190). The purpose of the second light shield layer (220) is to prevent the front side light (240) from reaching the first channel layer, the first spacer layer, the first doped layer and the first barrier layer.

Figure 4F:
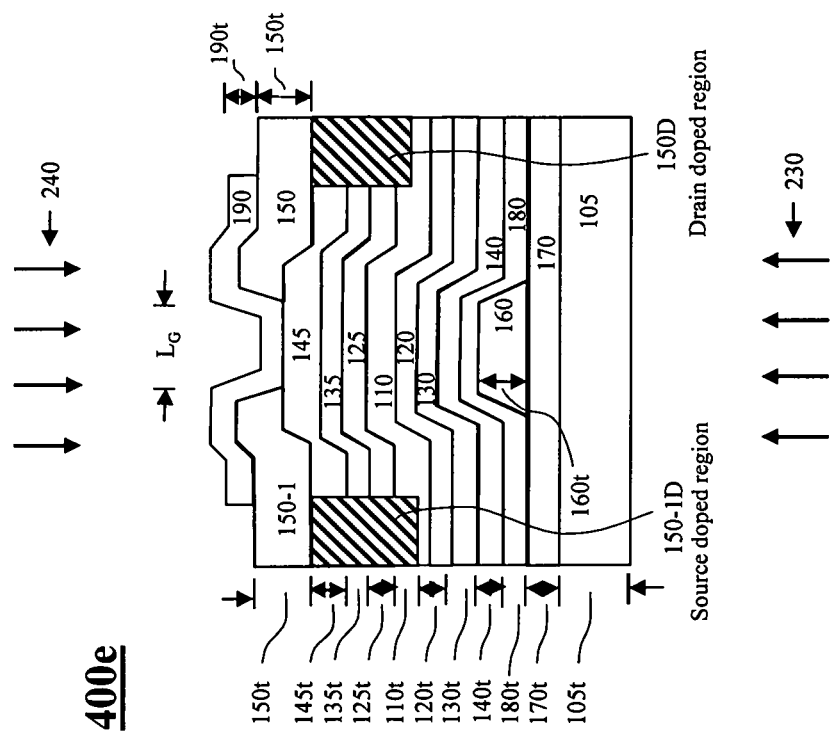
FIG. 4F is a cross-sectional view of a bottom gate double heterojunction HEM-TFT (400f) showing a first light shield layer (210) of a first light shield layer thickness (210t), a first light shield isolation layer (175) of a first light shield isolation layer thickness (175t), and a second light shield layer (220) of a second light shield layer thickness (220t) to prevent light from entering into the active area of the HEM-TFT (400f).

According to another embodiment of this invention, a first light shield layer (210) having a first light shield layer thickness (210*t*) and a first light shield isolation layer (175) having a first light shield isolation layer thickness (175*t*) are added in the bottom gate double heterojunction HEM-TFT (400*e*) to form a bottom gate double heterojunction HEM-TFT (400*f*) as shown in FIG. 4F. The first light shield layer (210) and first light shield isolation layer (175) are disposed on a top surface of the substrate barrier layer (170) and cover the entire top surface of the substrate barrier layer. The purpose of the first light shield layer (210) is to prevent the backside light (230) from reaching the first channel layer (110), the first/second spacer layers (120, 125), the first/second doped layers (130, 135) and the first/second barrier layers (140, 145). The HEM-TFT (4001) also composes of a second light shield layer (220) with a second light shield layer thickness (220*t*) disposed over the top surface of the surface passivation layer (190). The purpose of the second light shield layer (220) is to prevent the front-side light (240) from reaching the first channel layer, the first/second spacer layers, the first/second doped layers and the first/second barrier layers.

Materials for the first light shield layer (210) and the second light shield layer (220) may be selected from a group of metals, including but not limited to: Ti, W, Mo, Ta, Cr, Al, Ni, Cu, Ge, In, Au, Ag Hf, Pt, Pd, Co and their alloys. The first light shield layer thickness (210*t*) is selected to be in a range of 30-200 nm, and to sufficiently block the backside light (230). The second light shield layer thickness (220*t*) is selected to be in a range of 30-200 nm, to sufficiently prevent the front-side light (240) from entering the active area of the HEM-TFTs (300*f*, 400*f*). Materials of the first light shield isolation layer (175) are selected from an insulator group including but not limited to: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, SrO, ScO, $Y_2O_3$, LaO, LuO, ZnN, InN, GaN, SnN, AlN, HfN, ZrN, TiN, CaN, MgN, SiN, BN, BaN, TaN, MoN, WN, GdN, SrN, ScN, YN, LaN, LuN, ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures.

What is claimed is:

1. A bottom gate high electron mobility thin film transistor (HEM-TFT) with channel layer materials selected from a group of metal oxides, metal oxynitrides, metal nitrides and their mixtures comprising, a substrate having a substrate thickness and substrate energy gap;

a first gate with a first gate length, a first gate thickness and a first gate work function disposed on said substrate;

a first barrier layer with a first barrier layer thickness and a first barrier layer electron affinity disposed on said first gate and substrate;

a first doped layer with a first doped layer thickness, a first doped layer electron affinity and a first doped layer electron mobility, containing first doped layer impurity atoms with a first doped layer impurity concentration, disposed on said first barrier layer;

a first spacer layer with a first spacer layer thickness and a first spacer layer electron affinity, disposed on said first doped layer-, a first channel layer with a first channel layer thickness, a first channel layer electron affinity and a first channel layer electron mobility, disposed on said first spacer layer, wherein said first channel layer is not intentionally doped or has a low first channel layer doping concentration, forming a single heterojunction between said first bather layer and said first channel layer;

a first source with a first source thickness and a first drain with a first drain thickness covering parts of said first channel layer; and a surface passivation layer with a surface passivation layer thickness disposed on top of said HEM-TFT to improve thermal stability, wherein said first channel layer electron affinity is greater than said first doped layer electron affinity, said first barrier layer electron affinity and said first spacer layer electron affinity, forming a first potential well in said first channel layer so that electrons thermally excited from said first doped layer impurity atoms in said first doped layer drop into said first potential well with a high first channel layer electron mobility, whereas a gate voltage applied between said first gate and said first source regulates density of said electrons in said first channel layer or first potential well, a drain voltage applied between said first drain and said first source effects the flow of electrons in said first channel layer in the direction from said first source to said first drain to form a drain current.

2. A bottom gate HEM-TFT with channel layer materials selected from a group of metal oxides, metal oxynitrides, metal nitrides and their mixtures as defined in claim 1, materials of said first channel layer includes: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, SrO, ScO, $Y_2O_3$, LaO, LuO, ZnON, InON, GaON, SnON, AlON, HfON, ZrON, TiON, CaON, MgON, SiON, BON, BaON, TaON, MoON, WON, GdON, SrON, ScON, YON, LaON, LuON, ZnN, InN, GaN, SnN, AlN, HfN, ZrN, TiN, CaN, MgN, SiN, BN, BaN, TaN, MoN, WN, GdN, SrN, ScN, YN, LaN, LuN and their mixtures, wherein said first channel layer thickness is in a range of 1 to 200 nm.

3. A bottom gate HEM-TFT with channel layer materials selected from a group of metal oxides, metal oxynitrides, metal nitrides and their mixtures as defined in claim 1, materials of said first doped layer, first barrier layer and first spacer layer are selected from a material group including: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, $Sr_2O_3$, ScO, $Y_2O_3$, LaO, LuO, ZnON, InON, GaON, SnON, AlON, HfON, ZrON, TiON, CaON, MgON, SiON, BON, BaON, TaON, MoON, WON, GdON, SrON, ScON, YON, LaON, LuON, ZnN, InN, GaN, SnN, AlN, HfN, ZrN, TiN, CaN, MgN, SiN, BN, BaN, TaN, MoN, WN, GdN, SrN, ScN, YN, LaN, LuN and their mixtures, wherein said first doped layer thickness and said first barrier layer thickness are in a range of 0.5 to 50 nm and said first spacer layer thickness is in a range of 0.3 to 5 run.

4. A bottom gate HEM-TFT with channel layer materials selected from a group of metal oxides, metal oxynitrides, metal nitrides and their mixtures as defined in claim 1, materials of said first gate are selected from a group of metals and metal alloys including: Ti, Ge, In, Hf, Al, Ni, Pt, Co, Pd, Mo, Ta, W, Cu, Ag, Au and their alloys, wherein said first gate thickness is in a range of 10 to 3000 nm and said first gate length is in a range of 5 to 3000 nm.

5. A bottom gate HEM-TFT with channel layer materials selected from a group of metal oxides, metal oxynitrides, metal nitrides and their mixtures as defined in claim 1, further comprising a second bather layer with a second bather layer thickness and a second bather layer electron affinity; a second doped layer with a second doped layer thickness and a second doped layer electron affinity, containing second doped layer impurity atoms with a second doped layer impurity concentration; and a second spacer layer with a second spacer layer thickness and a second spacer layer electron affinity, inserted between said first channel layer and said first source and first drain with said second spacer layer contacting said first channel layer and said second bather layer contacting said first source and first drain, forming a bottom gate double heterojunction HEM-TFT, wherein said first channel layer electron affinity is greater than said second doped layer electron affinity, said second spacer layer electron affinity and said second barrier layer electron affinity, whereas materials for said second doped layer, second bather layer, and second spacer layer are selected from a group including: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, $Sr_2O_3$, ScO, $Y_2O_3$, LaO, LuO, ZnON, InON, GaON, SnON, AlON, HfON, ZrON, TiON, CaON, MgON, SiON, BON, BaON, TaON, MoON, WON, GdON, SrON, ScON, YON, LaON, LuON, ZnN, InN, GaN, SnN, AlN, HfN, ZrN, TiN, CaN, MgN, BN, BaN, TaN, MoN, WN, GdN, SrN, ScN, YN, LaN, LuN and their mixtures, said second doped layer thickness and said second bather layer thickness are in a range of 0.5 to 50 nm and said second spacer layer thickness is in a range of 0.3 to 5 nm.

6. A bottom gate HEM-TFT with channel layer materials selected from a group of metal oxides, metal oxynitrides, metal nitrides and their mixtures as defined in claim 1, further comprising a substrate barrier layer with a substrate barrier layer thickness disposed on said substrate to reduce defects and contaminants and to enhance lifetime stability of said HEM-TFT, wherein materials of said substrate barrier layer are selected from a group including: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, SrO, ScO, $Y_2O_3$, LaO, LuO, ZnN, InN, GaN, SnN, AlN, HfN, ZrN, TiN, CaN, MgN, SiN, BN, BaN, TaN, MoN, WN, GdN, SrN, ScN, YN, LaN, LuN, ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures, whereas said substrate barrier layer thickness is in a range of 5 nm to 10 μm.

7. A bottom gate HEM-TFT with channel layer materials selected from a group of metal oxides, metal oxynitrides, metal nitrides and their mixtures as defined in claim 1, further comprising a first gate insulator layer with a first gate insulator thickness inserted between said first gate and said first barrier layer to reduce leakage current between said first gate and said first source, wherein materials of said first gate insulator layer may be selected from a group including: ZnO, $In_2O_3$, $Ga_2O_3$, SnO, $Al_2O_3$, $ZrO_2$, $TiO_2$, CaO, MgO, $SiO_2$, $B_2O_3$, BaO, TaO, MoO, WO, GdO, SrO, ScO, $Y_2O_3$, LaO, LuO, ZnN, InN, GaN, SnN, AlN, HfN, ZrN, TiN, CaN, MgN, SiN, BN, BaN, TaN, MoN, WN, GdN, SrN, ScN, YN, LaN, LuN, ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures, said first gate insulator thickness is in a range of 1 to 300 nm.

8. A bottom gate HEM-TFT with channel layer materials selected from a group of metal oxides, metal oxynitrides, metal nitrides and their mixtures as defined in claim 1, wherein materials of said surface passivation layer may be selected from a group including: ZnO, $In_2O_3$, $Ga_2O_3$, SnO, $Al_2O_3$, $HfO_2$, $ZrO_2$, $TiO_2$, CaO, MgO, $SiO_2$, $B_2O_3$, BaO, TaO, MoO, WO, GdO, SrO, ScO, $Y_2O_3$, LaO, LuO, ZnN, InN, GaN, SnN, AlN, HfN, ZrN, TiN, CaN, MgN, SiN, EN, BaN, TaN, MoN, WN, GdN, SrN, ScN, YN, LaN, LuN, ZnON, InON, GaON, SnON, AlON, HfON, ZrON, TiON, CaON, MgON, SiON, BON, BaON, TaON, MoON, WON, GdON, SrON, ScON, YON, LaON, LuON and their mixtures, said surface passivation layer thickness is in a range of 20 to 5000 nm.

9. A bottom gate HEM-TFT with channel layer materials selected from a group of metal oxides, metal oxynitrides, metal nitrides and their mixtures as defined in claim 1, further comprising a first light shield layer and a first light shield isolation layer positioned beneath said single heterojunction with said first light shield isolation layer on top of said first light shield layer; and a second light shield layer disposed on top of said surface passivation layer to minimize light from reaching said first channel layer, wherein materials of said first light shield layer and second light shield layer may be selected from a group of metal and metal alloys, including Ti, Ge, In, Hf, Al, Ni, Pt, Co, Pd, Mo, Ta, W, Cu, Ag, Au and their alloys and thickness of said first and second light shield layers is in a range of 30 to 200 nm.

10. A bottom gate HEM-TFT with channel layer materials selected from a group of metal oxides, metal oxynitrides, metal nitrides and their mixtures as defined in claim 1, further comprising a first source doped region under said first source and a first drain doped region under said first drain to reduce series resistance between said first source and said first drain.

* * * * *